(12) United States Patent
Yamakawa et al.

(10) Patent No.: US 10,559,567 B2
(45) Date of Patent: Feb. 11, 2020

(54) SEMICONDUCTOR DEVICE AND METHOD OF MANUFACTURING THE SAME

(71) Applicant: Sony Corporation, Tokyo (JP)

(72) Inventors: Shinya Yamakawa, Kanagawa (JP); Yasushi Tateshita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/241,395

(22) Filed: Jan. 7, 2019

(65) Prior Publication Data

US 2019/0157271 A1    May 23, 2019

Related U.S. Application Data

(63) Continuation of application No. 15/852,041, filed on Dec. 22, 2017, now Pat. No. 10,269,801, which is a
(Continued)

(30) Foreign Application Priority Data

Mar. 20, 2007 (JP) .................. 2007-072968
Jan. 30, 2008 (JP) .................. 2008-018513

(51) Int. Cl.
   *H01L 27/092* (2006.01)
   *H01L 21/285* (2006.01)
   (Continued)

(52) U.S. Cl.
   CPC .... *H01L 27/0922* (2013.01); *H01L 21/28518* (2013.01); *H01L 21/31053* (2013.01);
   (Continued)

(58) Field of Classification Search
   CPC .................................. H01L 27/0922
   See application file for complete search history.

(56) References Cited

U.S. PATENT DOCUMENTS 6,573,172 B1   6/2003  En et al.
7,326,634 B2   2/2008  Lindert et al.
(Continued)

FOREIGN PATENT DOCUMENTS

CN   1505839   6/2004
CN   1925159   3/2007
(Continued)

OTHER PUBLICATIONS

J. Wang, et al., "Novel Channel-Stress Enhancement Technology with eSiGe S/D and Recessed Channel on Damascence Gate Process", 2007 Symposium on VLSI Technology, Digest of Technical Papers; Jun. 12-14, 2007, Kyoto.
(Continued)

*Primary Examiner* — William A Harriston
(74) *Attorney, Agent, or Firm* — Michael Best & Friedrich LLP

(57) ABSTRACT

A semiconductor device including, in cross section, a semiconductor substrate; a gate insulating film on the semiconductor substrate; a gate electrode on the gate insulating film, the gate electrode including a metal, a side wall insulating film at opposite sides of the gate electrode, the side wall insulating film contacting the substrate; a stress applying film at the opposite sides of the gate electrode and over at least a portion of the semiconductor substrate, at least portion of the side wall insulating film being between the gate insulating film and the stress applying film and in contact with both of them; source/drain regions in the semiconductor substrate at the opposite sides of the gate electrode, and silicide regions at surfaces of the source/drain regions at the opposite sides of the gate electrode, the silicide regions being between the source/drain regions and the stress applying layer and in contact with the stress applying layer.

31 Claims, 26 Drawing Sheets

Related U.S. Application Data continuation of application No. 15/154,365, filed on May 13, 2016, now Pat. No. 9,881,920, which is a continuation of application No. 14/669,803, filed on Mar. 26, 2015, now Pat. No. 9,449,974, which is a continuation of application No. 12/530,797, filed as application No. PCT/JP2008/053424 on Feb. 27, 2008, now Pat. No. 9,070,783.

(51) Int. Cl.
*H01L 21/8238* (2006.01)
*H01L 29/66* (2006.01)
*H01L 29/78* (2006.01)
*H01L 21/3105* (2006.01)
*H01L 21/321* (2006.01)
*H01L 29/45* (2006.01)

(52) U.S. Cl.
CPC ...... *H01L 21/3212* (2013.01); *H01L 21/8238* (2013.01); *H01L 21/823807* (2013.01); *H01L 21/823814* (2013.01); *H01L 21/823828* (2013.01); *H01L 21/823864* (2013.01); *H01L 21/823871* (2013.01); *H01L 27/092* (2013.01); *H01L 29/45* (2013.01); *H01L 29/665* (2013.01); *H01L 29/66545* (2013.01); *H01L 29/66636* (2013.01); *H01L 29/7833* (2013.01); *H01L 29/7843* (2013.01); *H01L 29/7848* (2013.01)

(56) References Cited

U.S. PATENT DOCUMENTS

| | | | |
|---|---|---|---|
| 7,518,188 B2 | 4/2009 | Shima et al. | |
| 7,723,750 B2 | 5/2010 | Zhu et al. | |
| 7,816,766 B2 | 10/2010 | Tamura et al. | |
| 8,012,820 B2 | 9/2011 | Majumdar et al. | |
| 8,072,031 B2 * | 12/2011 | Shima | H01L 21/823807 257/368 |
| 8,426,298 B2 | 4/2013 | Ko et al. | |
| 8,841,181 B2 * | 9/2014 | Chou | H01L 21/823807 438/197 |
| 9,064,891 B2 * | 6/2015 | Koehler | H01L 21/28176 |
| 9,502,406 B1 * | 11/2016 | Park | H01L 21/28114 |
| 9,917,082 B1 * | 3/2018 | Basker | H01L 27/0629 |
| 10,163,704 B2 * | 12/2018 | Chen | H01L 29/6656 |
| 2005/0093078 A1 | 5/2005 | Chan et al. | |
| 2006/0081893 A1 | 4/2006 | Matsuo et al. | |
| 2006/0091432 A1 | 5/2006 | Guha et al. | |
| 2006/0094193 A1 | 5/2006 | Horstmann et al. | |
| 2006/0118880 A1 | 6/2006 | Komoda | |
| 2007/0023795 A1 | 2/2007 | Nagano et al. | |
| 2007/0222035 A1 | 9/2007 | Huang et al. | |
| 2007/0281405 A1 | 12/2007 | Luo et al. | |
| 2008/0006818 A1 | 1/2008 | Luo et al. | |
| 2008/0087966 A1 * | 4/2008 | Tai | H01L 21/823842 257/369 |
| 2008/0157200 A1 | 7/2008 | Kim et al. | |
| 2008/0179661 A1 | 7/2008 | Richter et al. | |
| 2008/0242015 A1 | 10/2008 | Lee et al. | |
| 2008/0265256 A1 | 10/2008 | Lin et al. | |
| 2010/0001323 A1 * | 1/2010 | Tateshita | H01L 29/7845 257/288 |
| 2010/0102394 A1 | 4/2010 | Yamakawa et al. | |
| 2010/0112798 A1 * | 5/2010 | Lai | H01L 21/823842 438/591 |
| 2010/0133628 A1 * | 6/2010 | Frohberg | H01L 21/28114 257/410 |
| 2013/0015525 A1 * | 1/2013 | Cheng | H01L 21/823814 257/351 |
| 2013/0175629 A1 * | 7/2013 | Chang | H01L 21/823475 257/368 |
| 2014/0110798 A1 * | 4/2014 | Cai | H01L 29/78 257/410 |
| 2016/0268256 A1 | 9/2016 | Yang et al. | |
| 2017/0186849 A1 * | 6/2017 | Chen | H01L 29/6656 |

FOREIGN PATENT DOCUMENTS

| | | |
|---|---|---|
| GB | 2434036 | 7/2007 |
| JP | 2002-198368 | 7/2002 |
| JP | 2003-258121 | 9/2003 |
| JP | 2005-005633 | 1/2005 |
| JP | 2005-057301 | 3/2005 |
| JP | 2005-259945 | 9/2005 |
| JP | 2006-093242 | 4/2006 |
| JP | 2006-165355 | 6/2006 |
| JP | 2006-253317 | 9/2006 |
| JP | 2006-269768 | 10/2006 |
| JP | 2007-023795 | 2/2007 |
| JP | 2007-059881 | 3/2007 |
| JP | 2007-067118 | 3/2007 |
| JP | 2007-103654 | 4/2007 |
| JP | 2007-165532 | 6/2007 |
| WO | WO-2006/094834 | 5/2006 |
| WO | WO-2008/038346 | 4/2008 |

OTHER PUBLICATIONS

International Search Report dated Mar. 20, 2007.
Japanese Office Examination Report issued in related Japanese Patent Application No. 10-2009-7015816 dated Dec. 23, 2013.
Japanese Office Examination Report issued in related Japanese Patent Application No. 2008-018513 dated Nov. 15, 2011.

* cited by examiner

[FIG. 1]
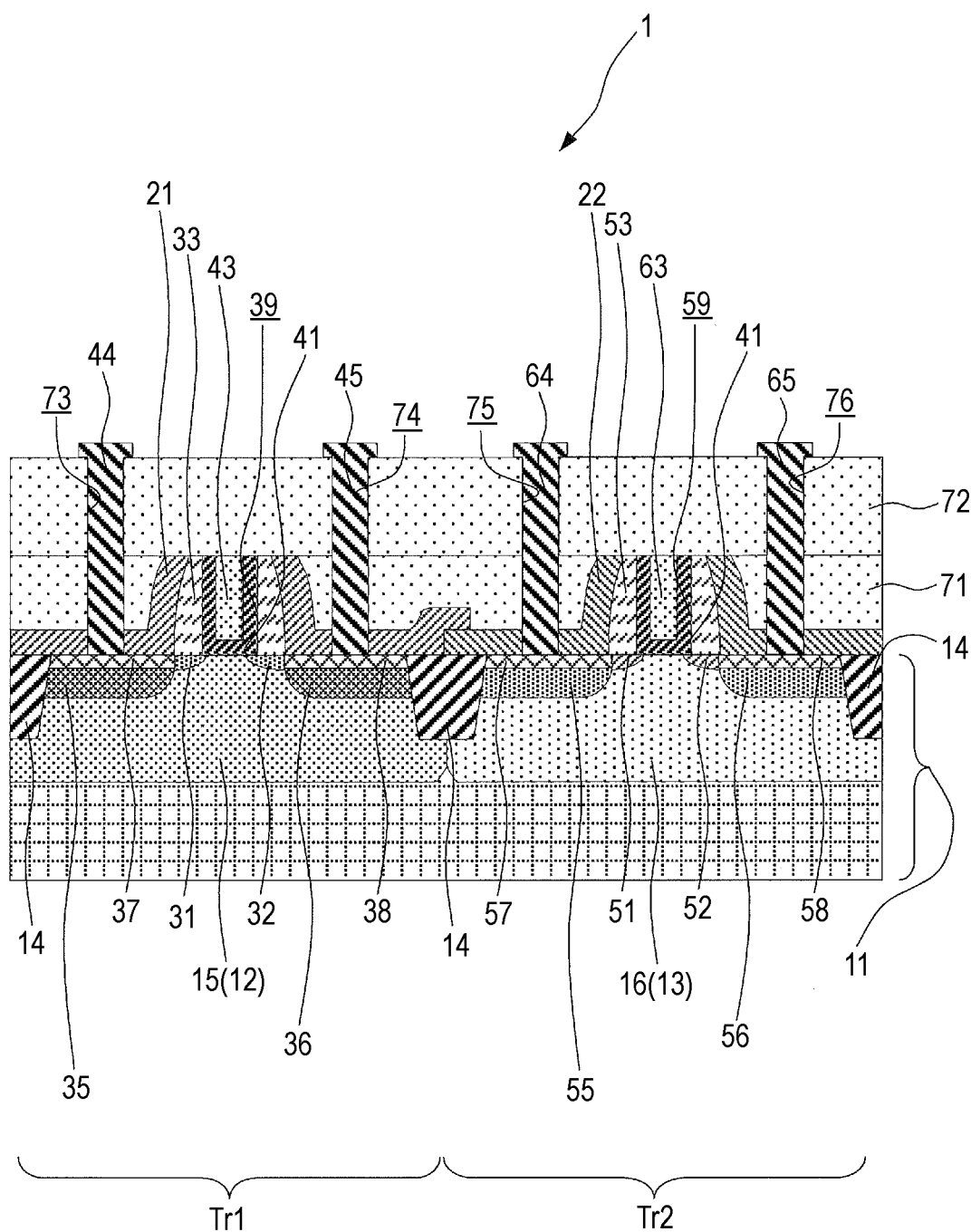

[FIG. 2]
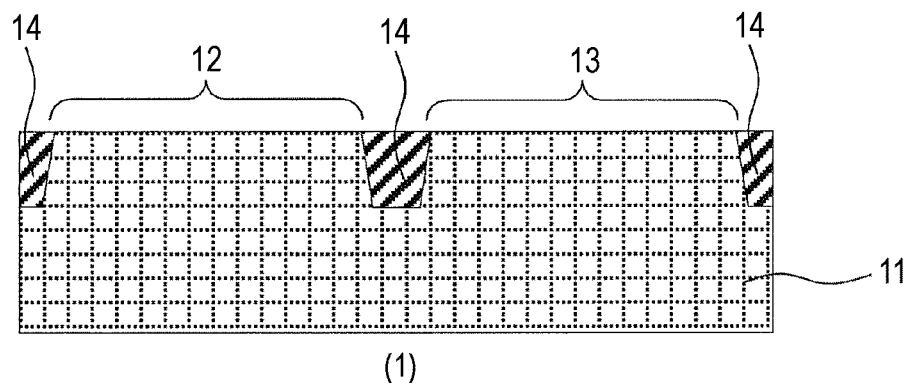
(1)
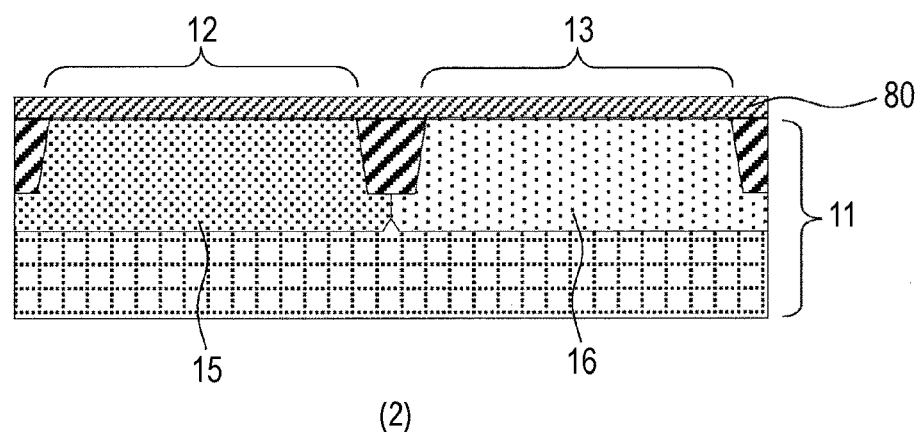
(2)
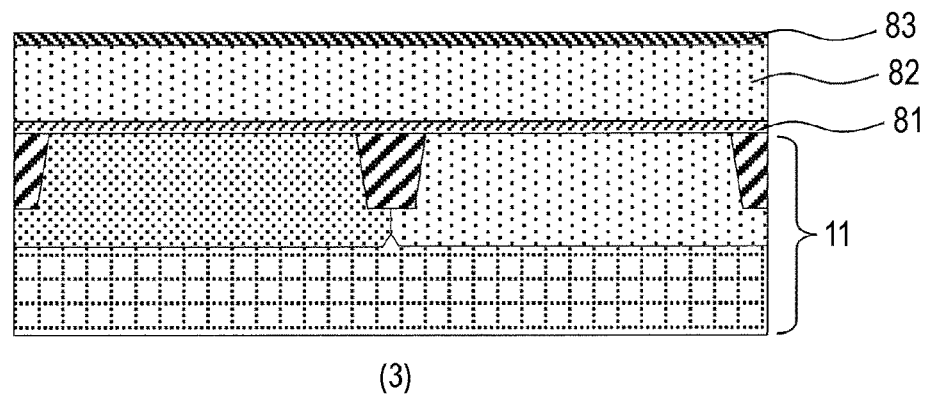
(3)

[FIG. 3]
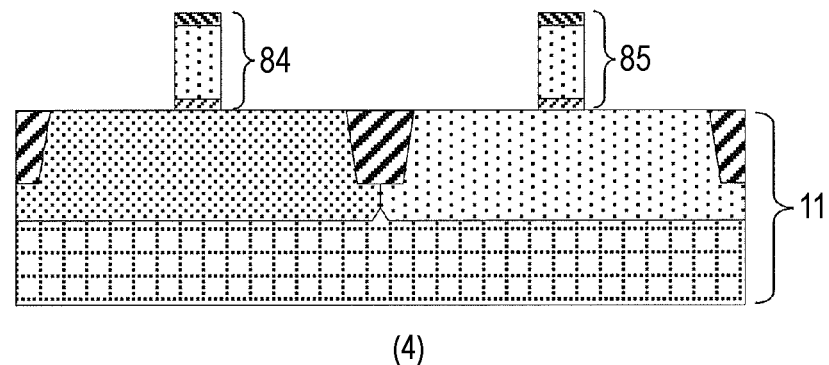
(4)
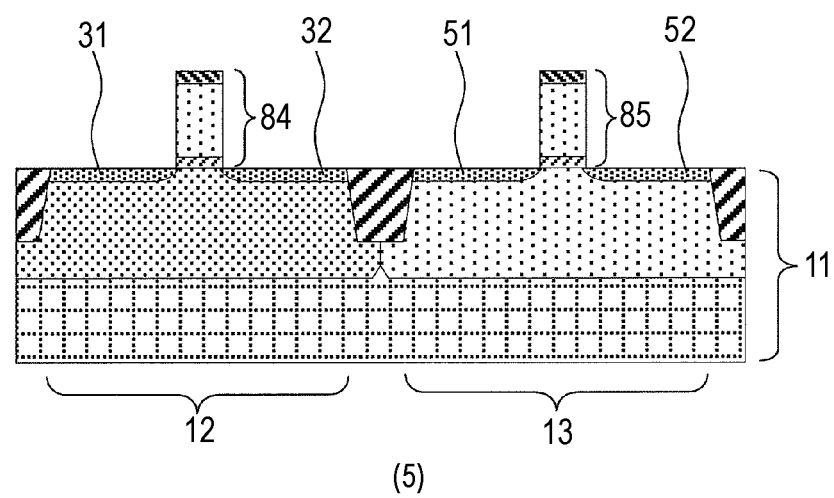
(5)
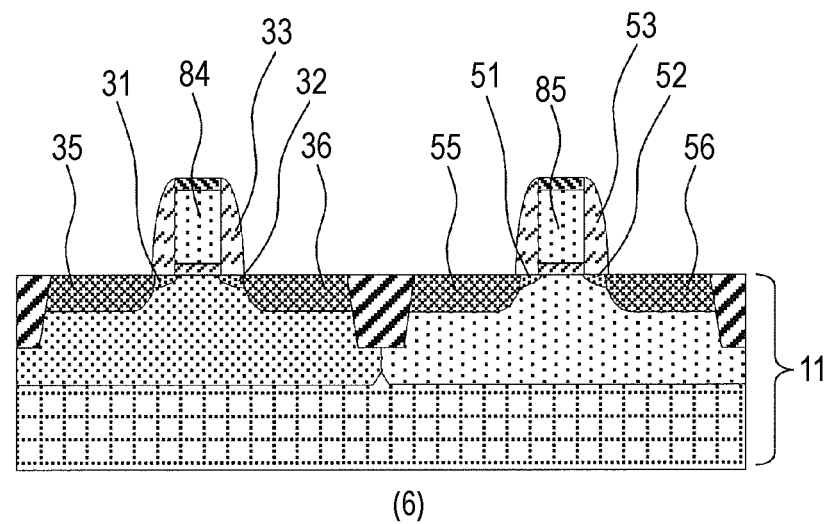
(6)

[FIG. 4]
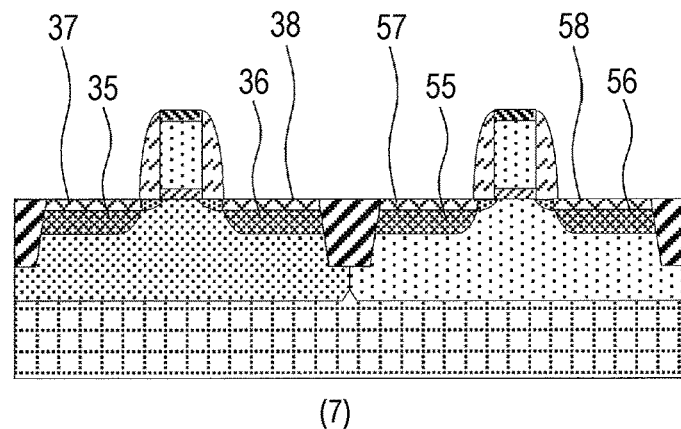
(7)
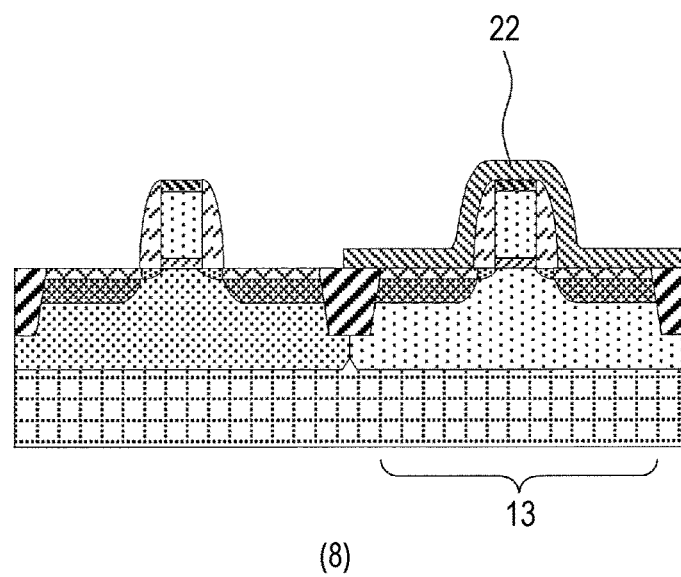
(8)
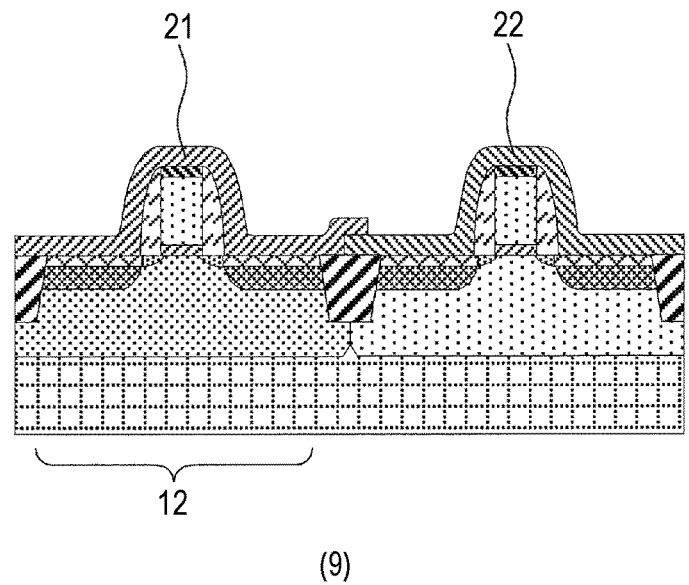
(9)

[FIG. 5]
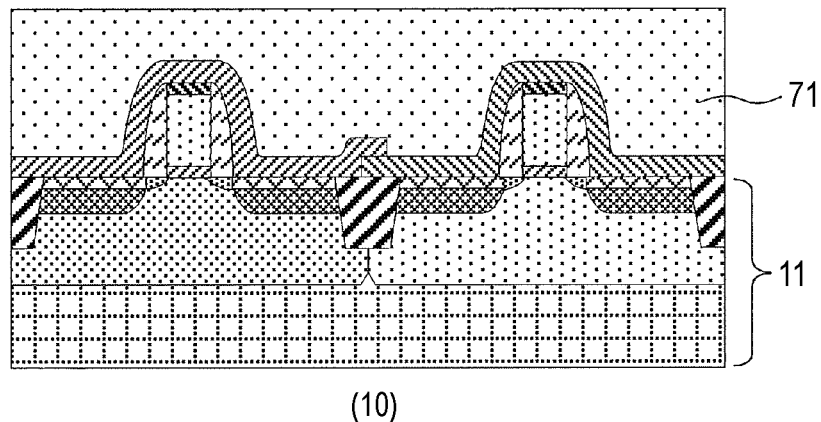
(10)
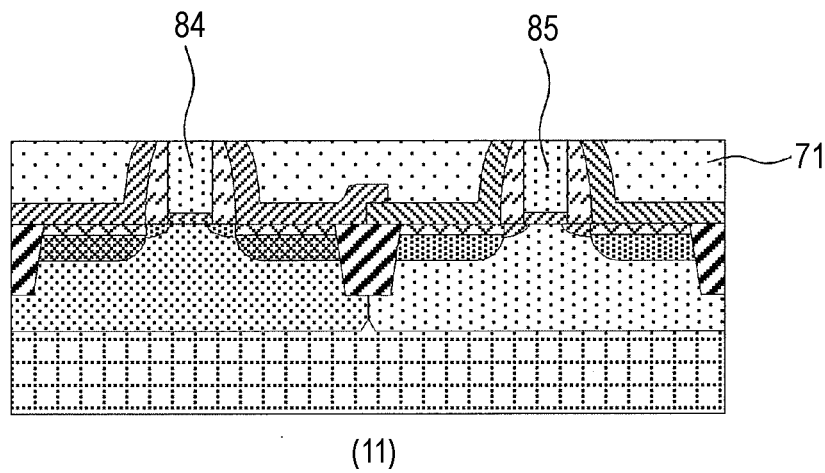
(11)
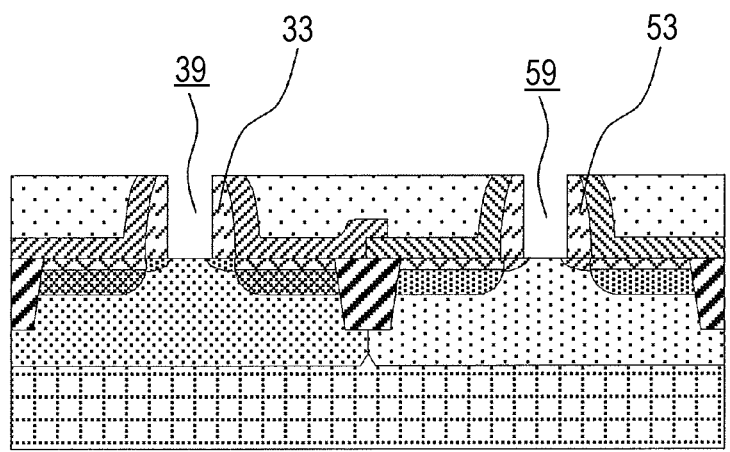
(12)

[FIG. 6]
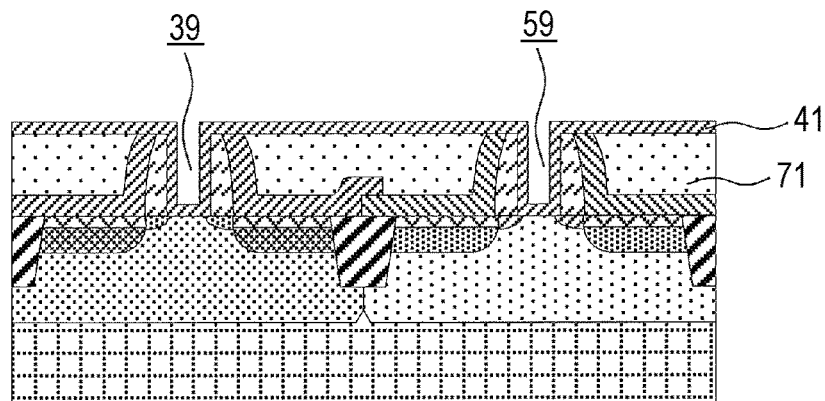
(13)
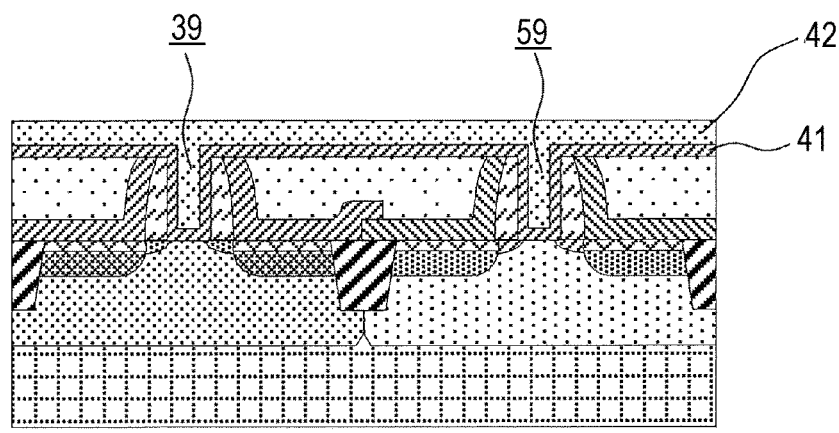
(14)
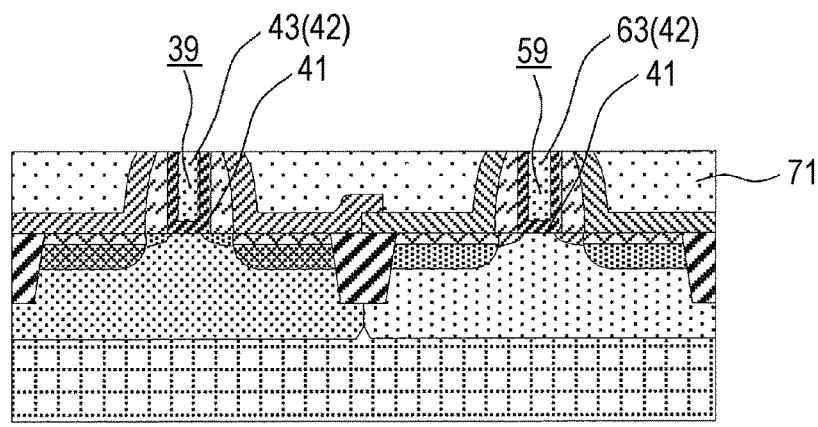
(15)

[FIG. 7]
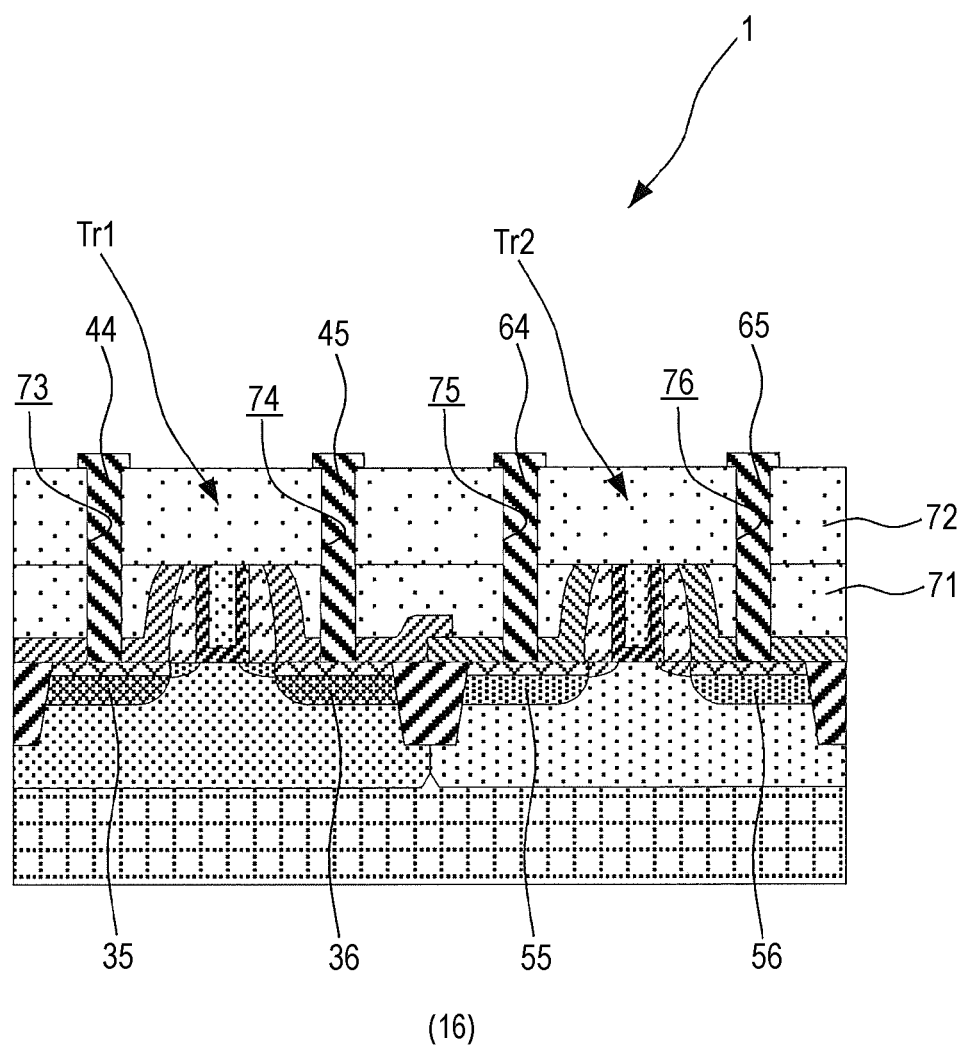

[FIG. 8]
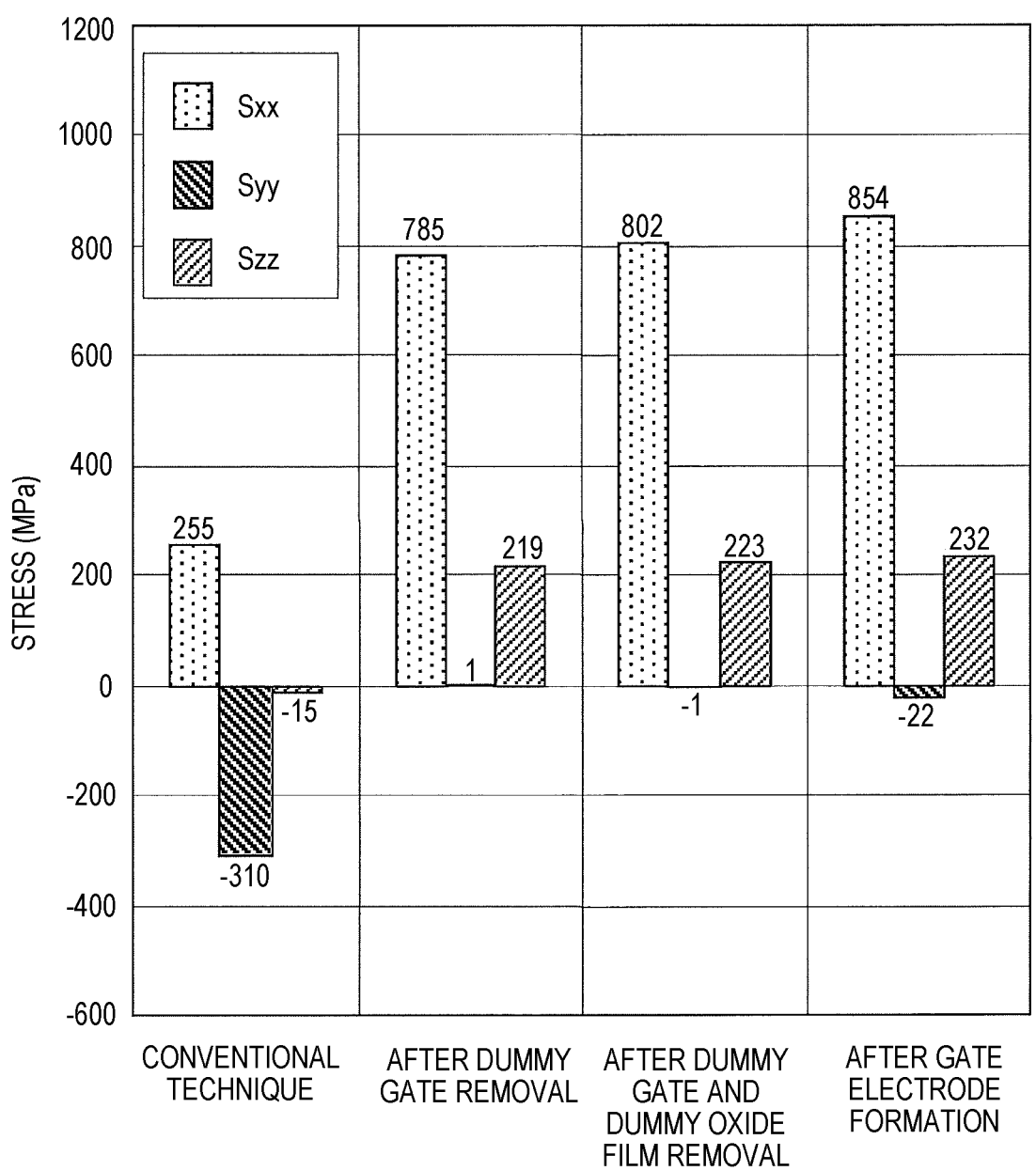

[FIG. 9]
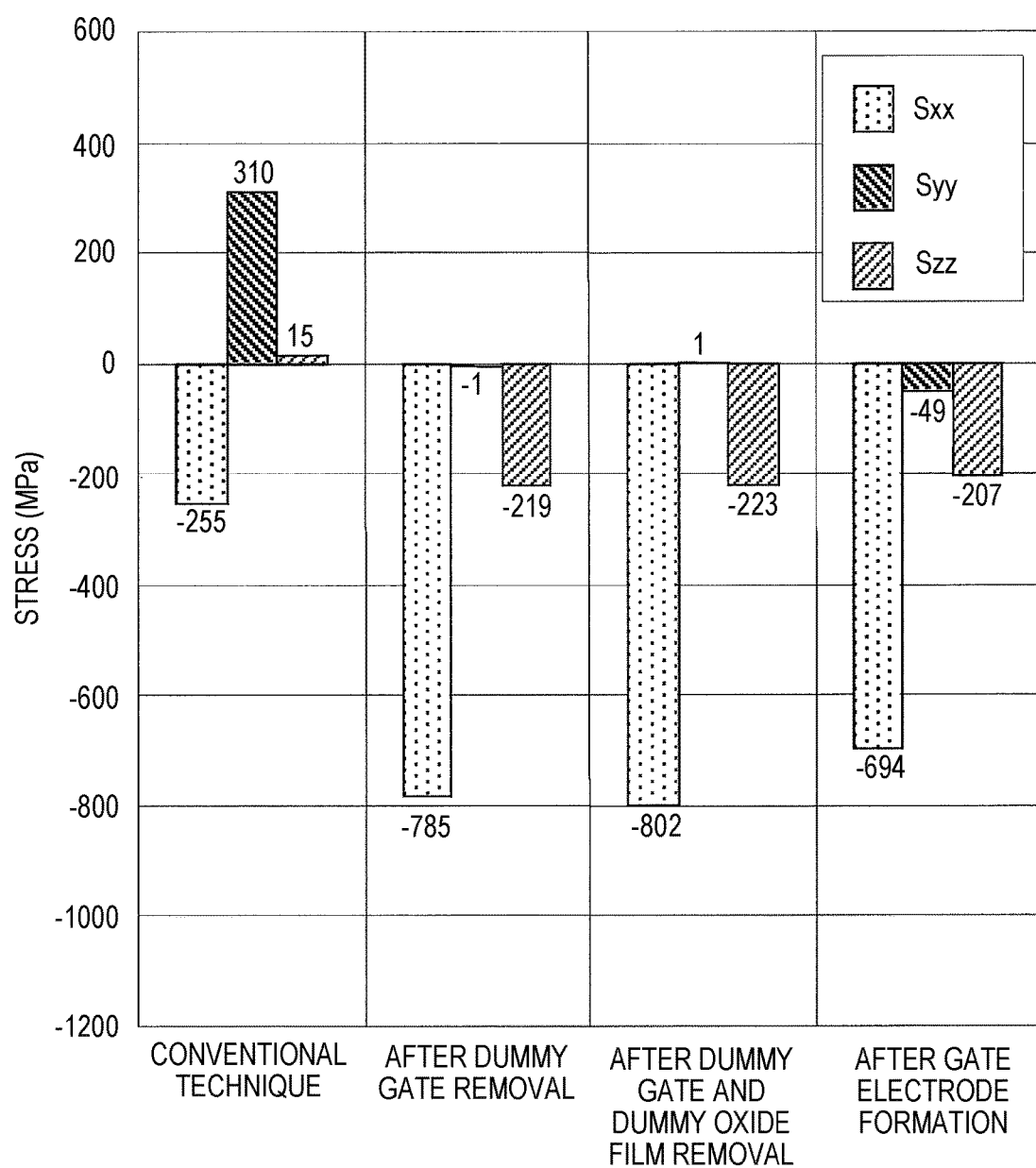

[FIG. 10]
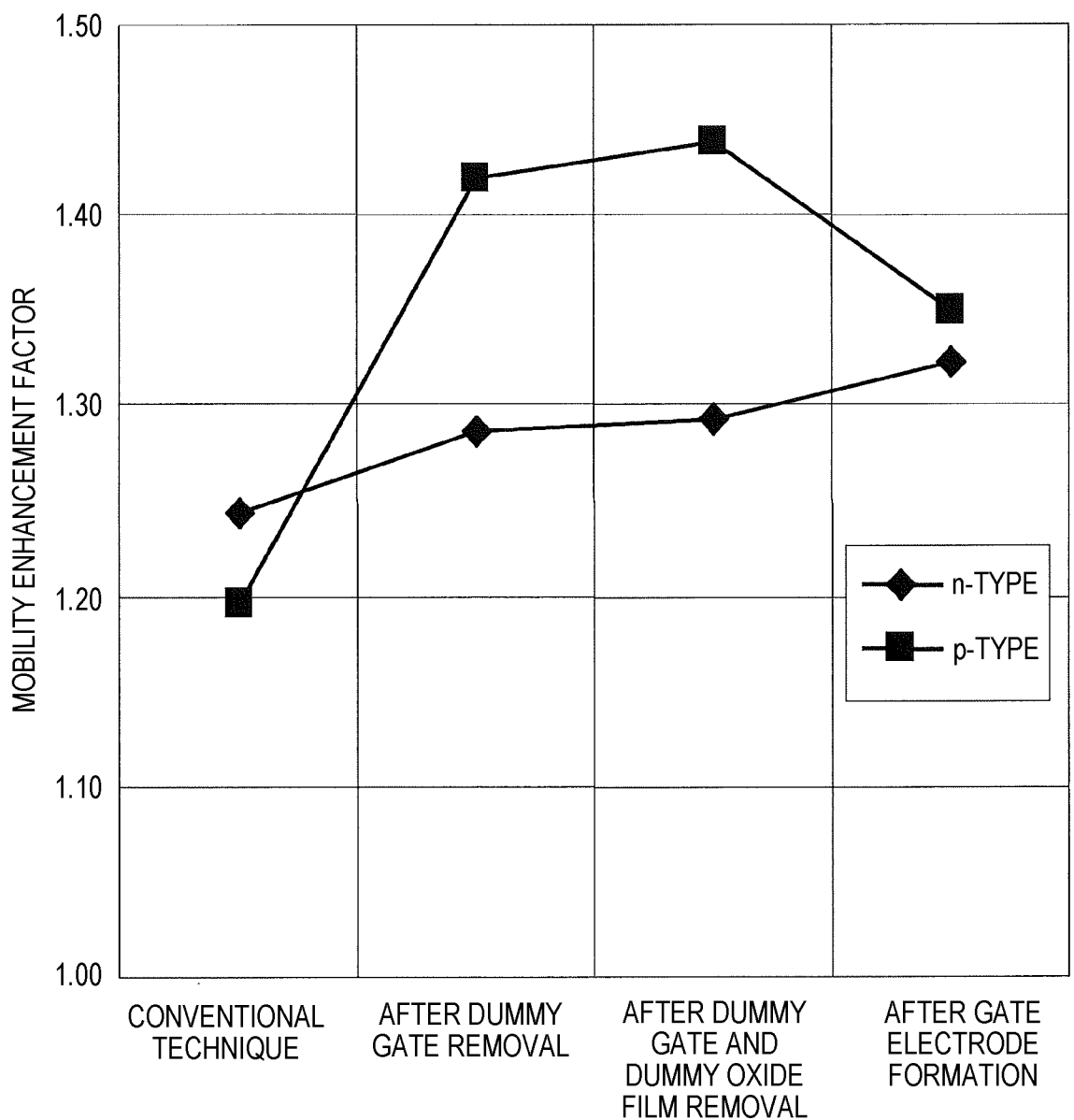

[FIG. 11]
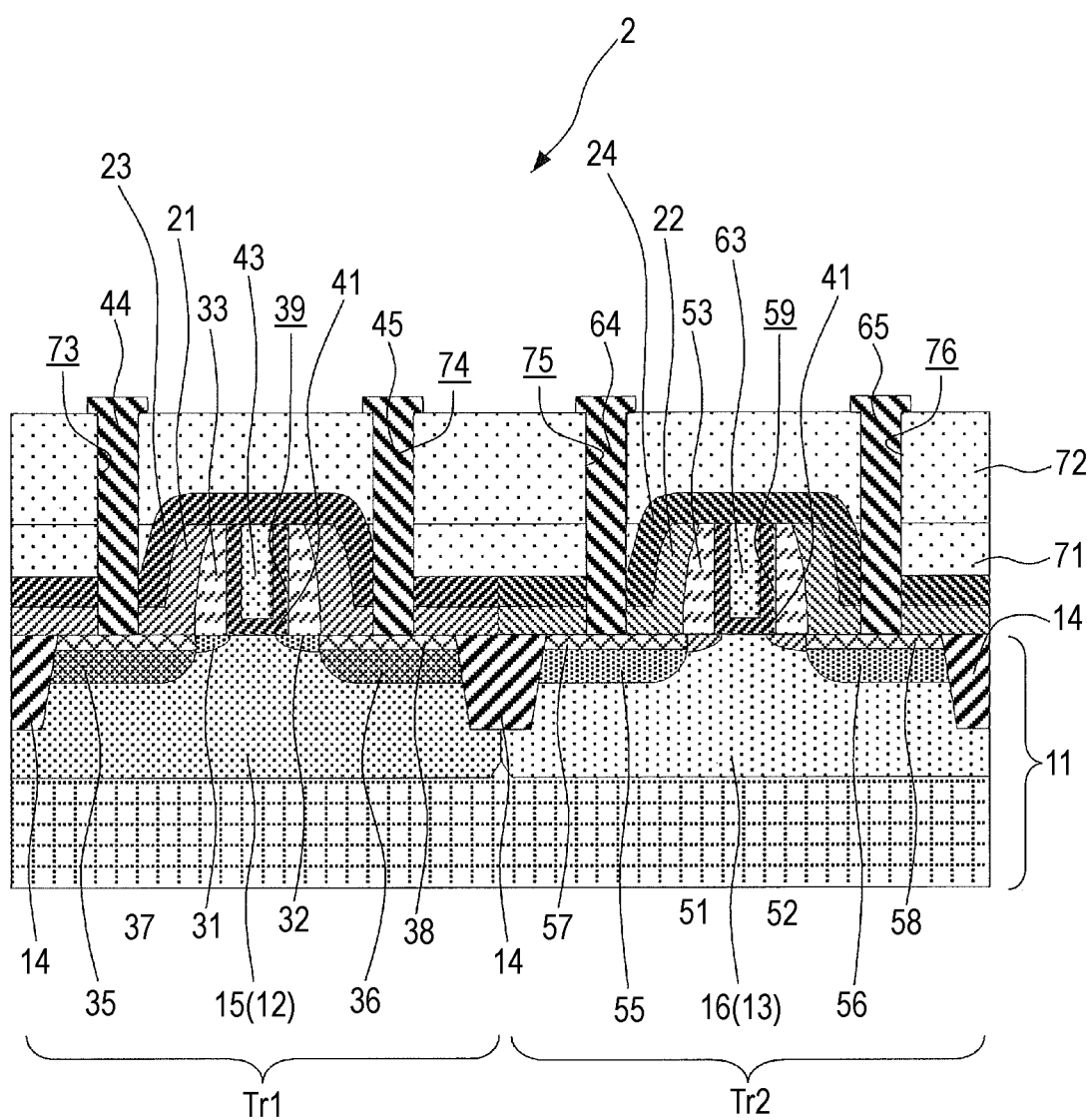

[FIG. 12]
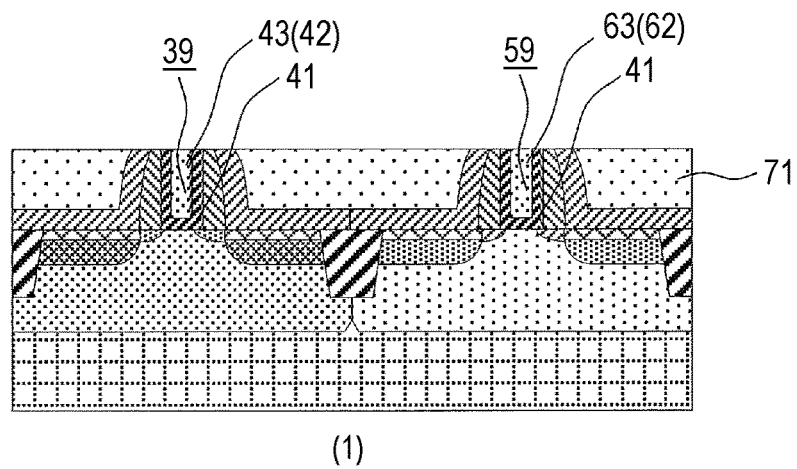
(1)
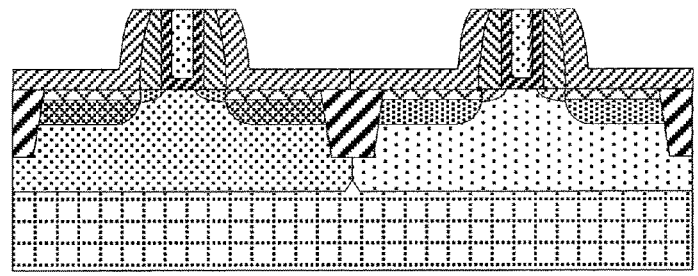
(2)
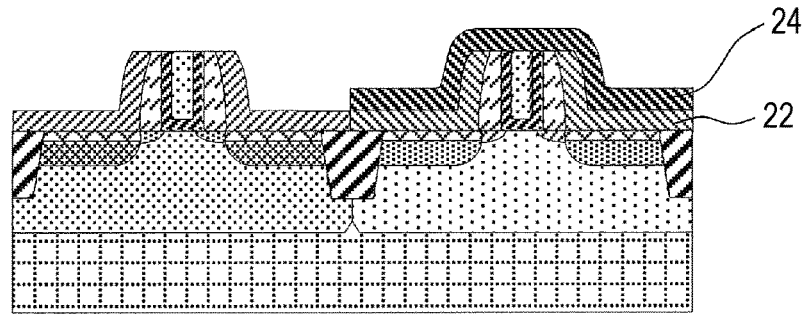
(3)

[FIG. 13]
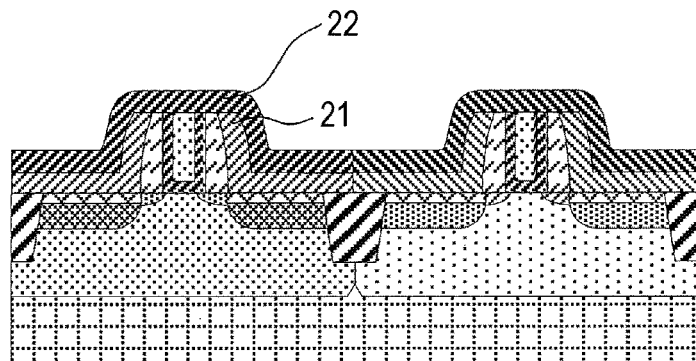
(4)
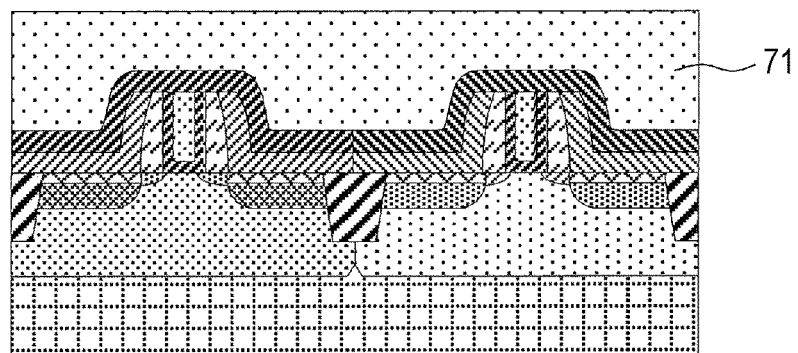
(5)
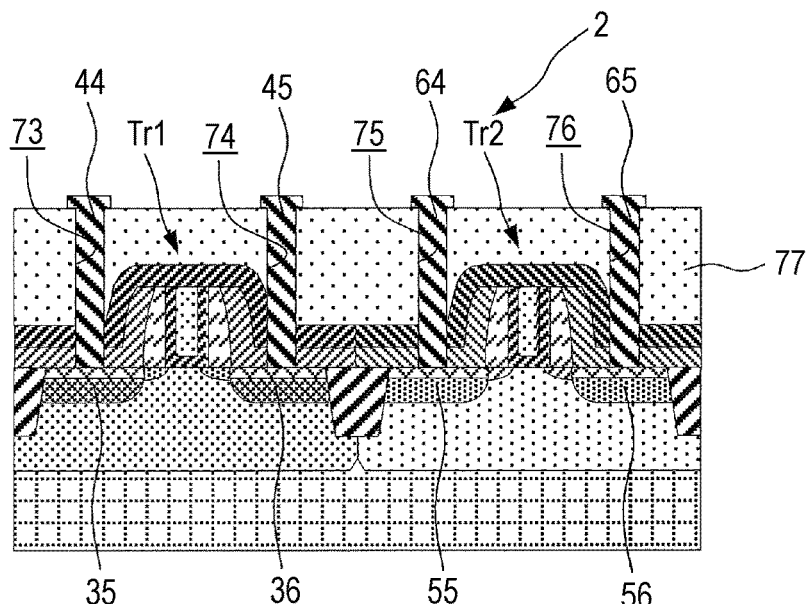
(6)

[FIG. 14]
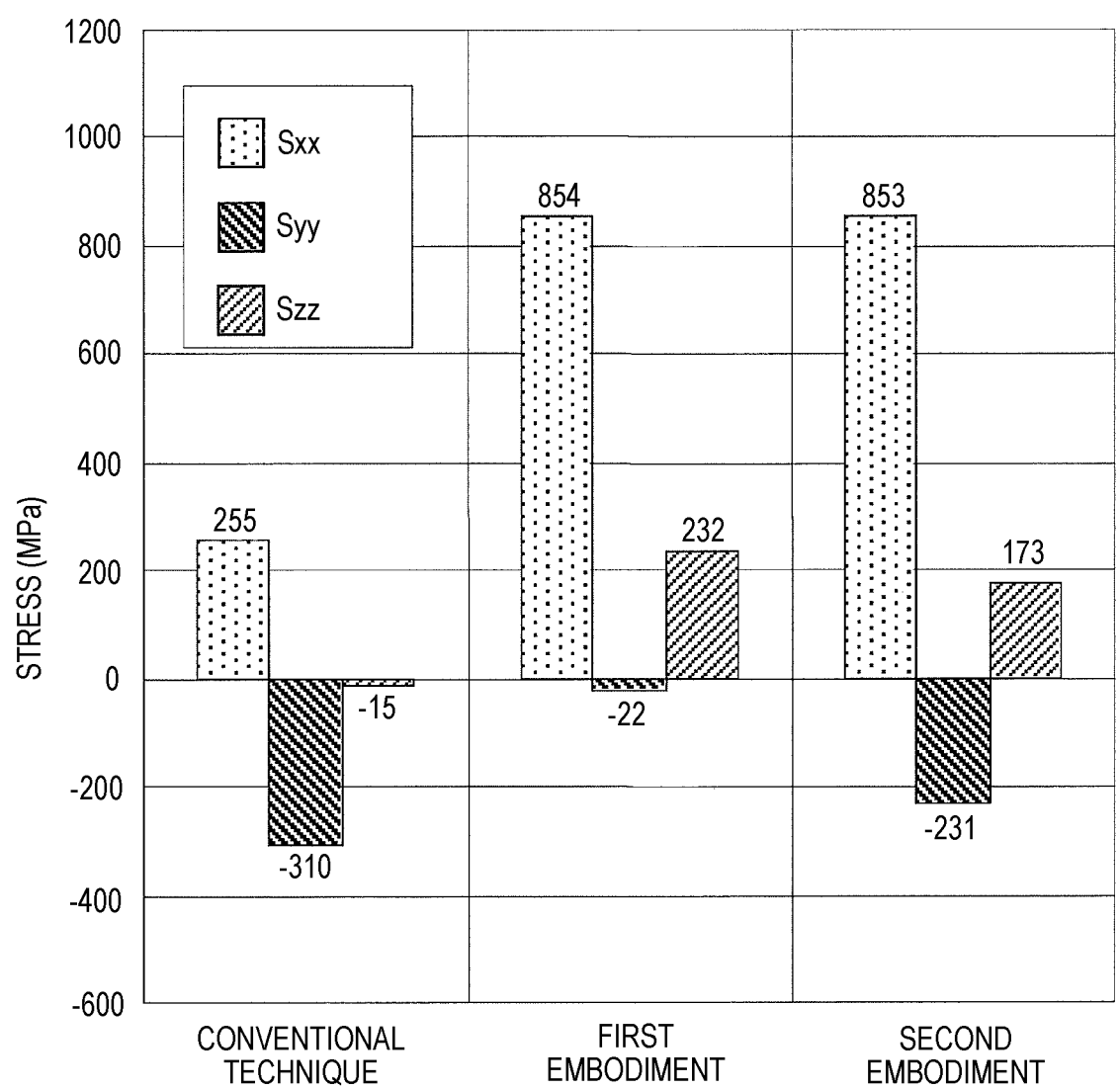

[FIG. 15]
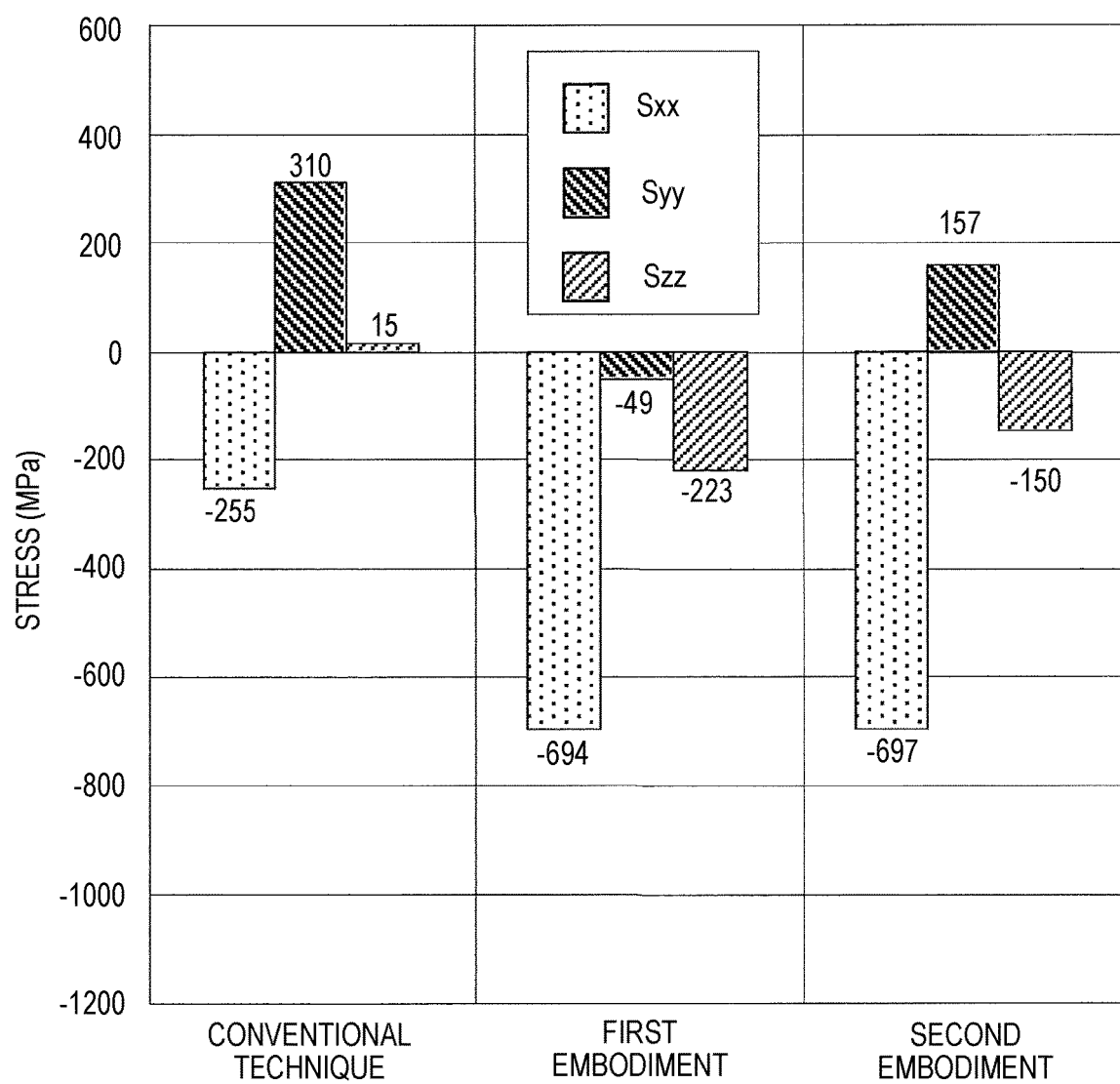

[FIG. 16]
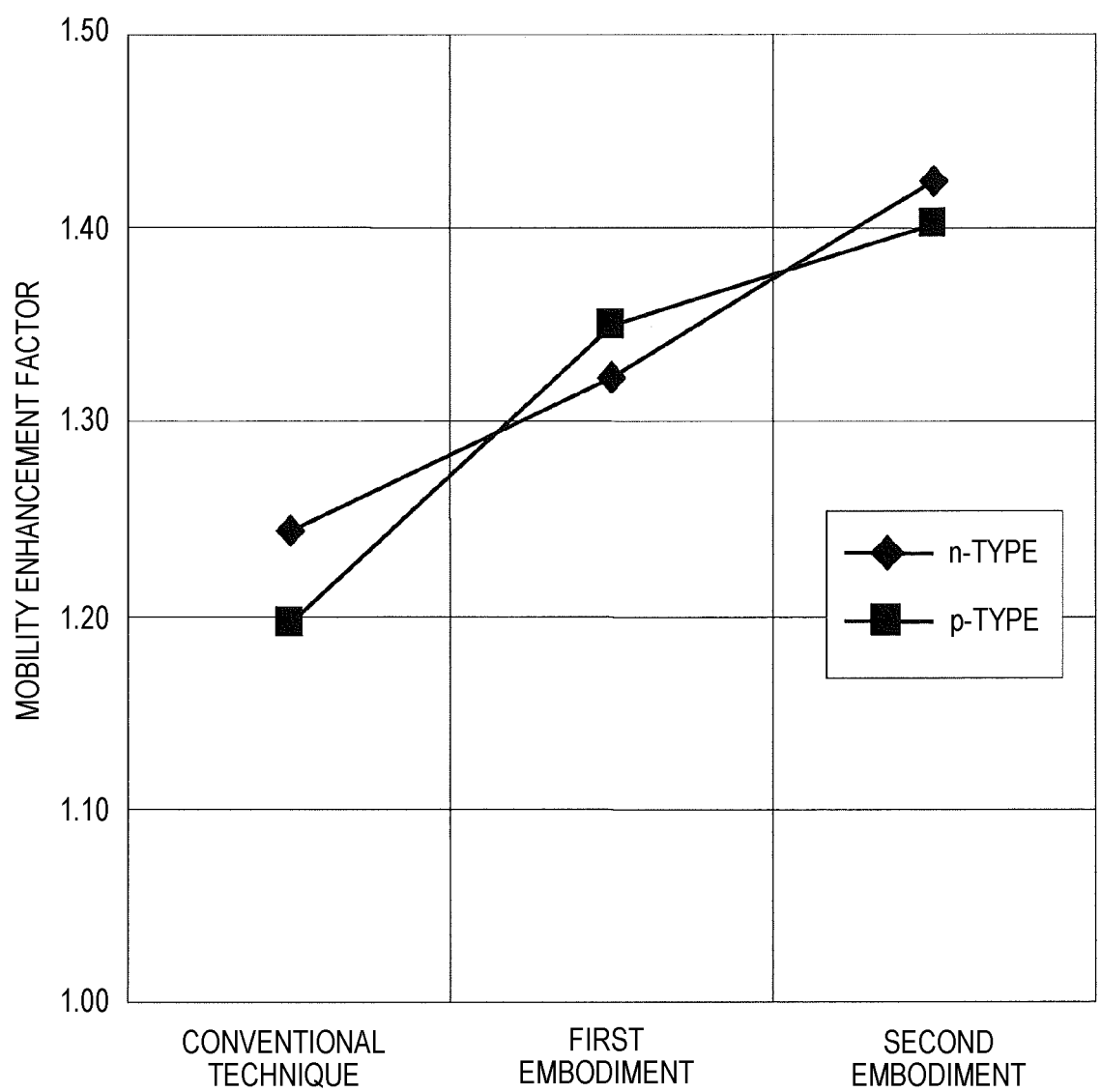

[FIG. 17]
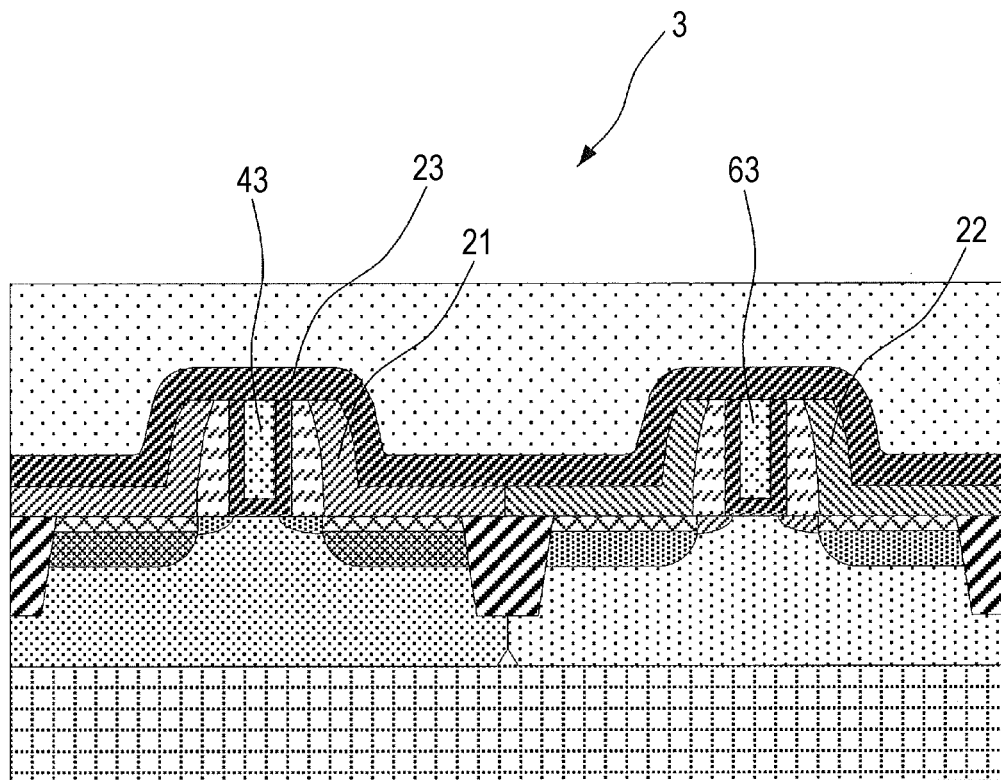
[FIG. 18]
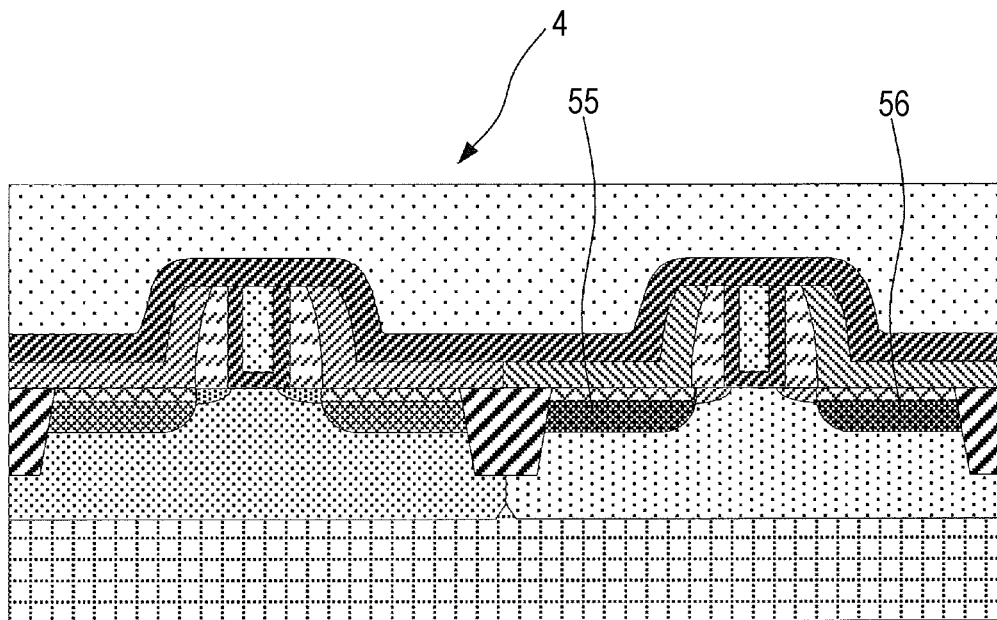

[FIG. 19]
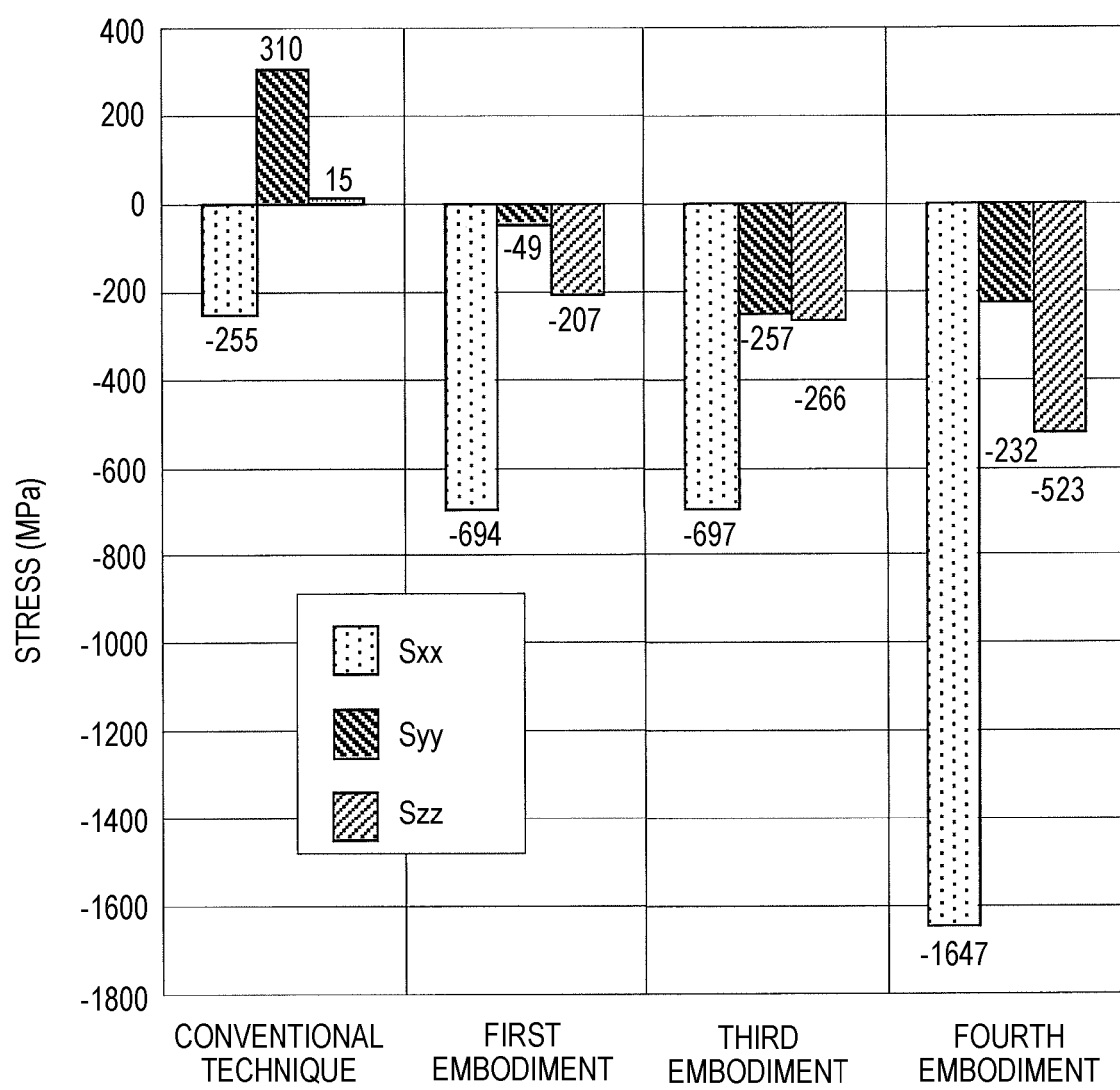

[FIG. 20]
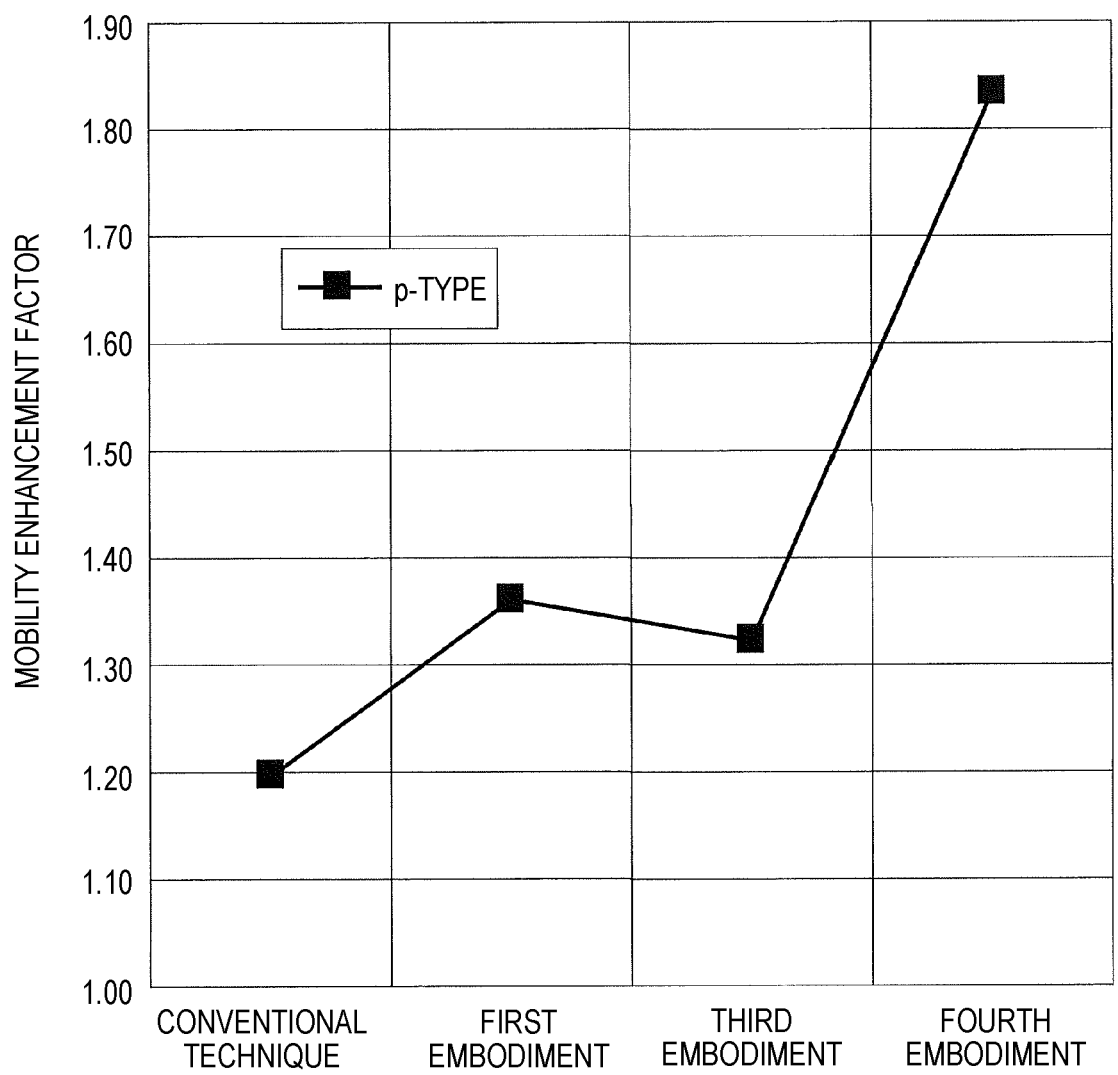

[FIG. 21]
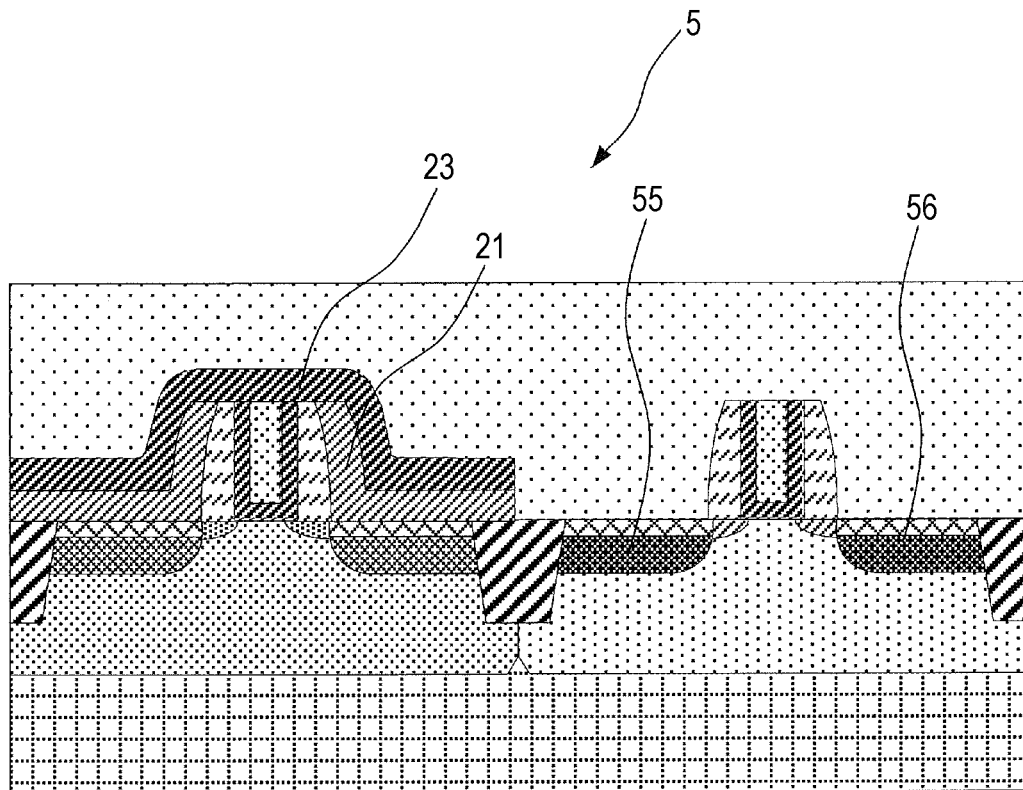
[FIG. 22]
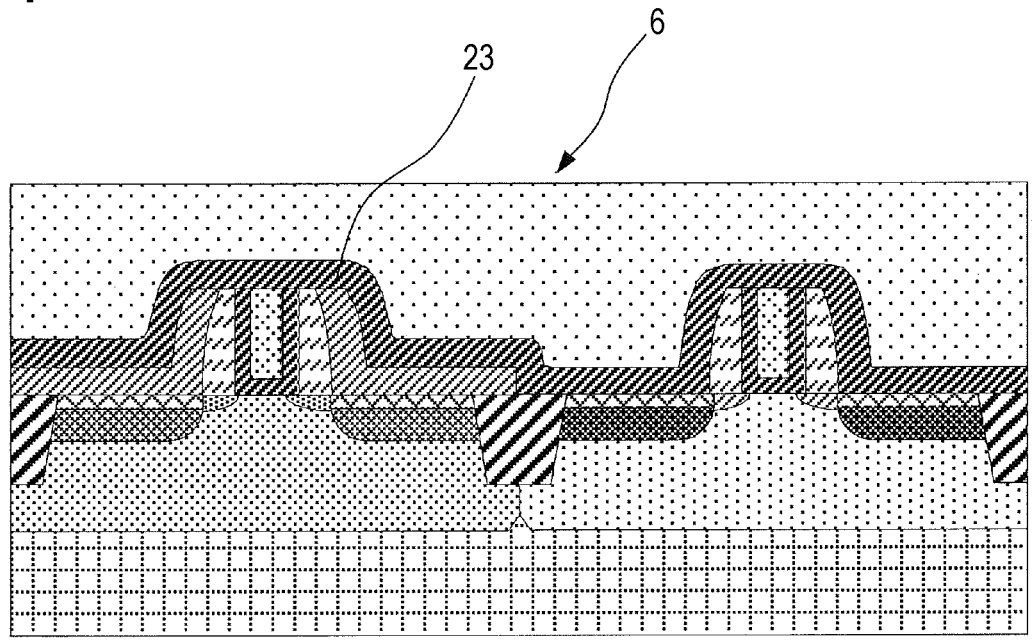

[FIG. 23]
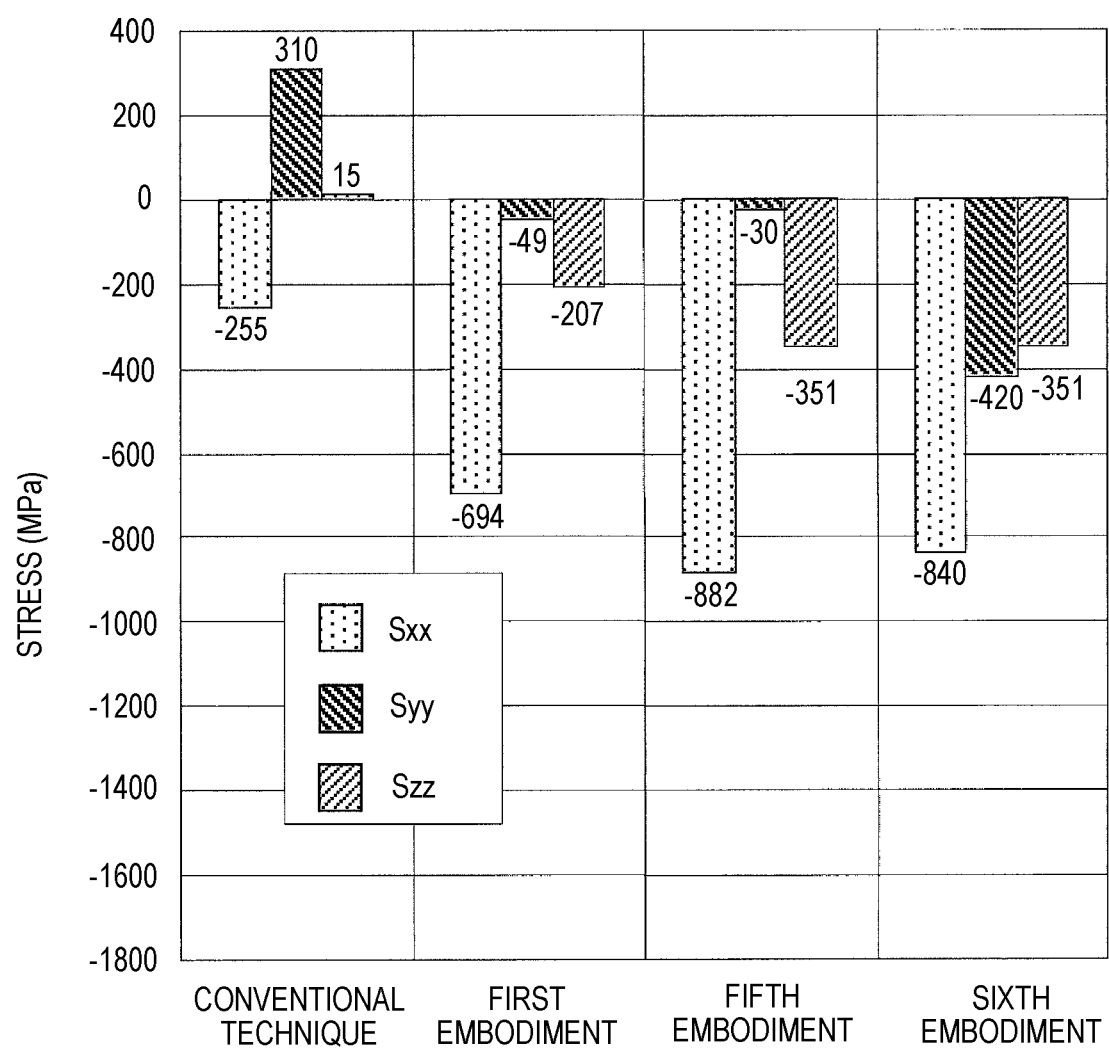

[FIG. 24]
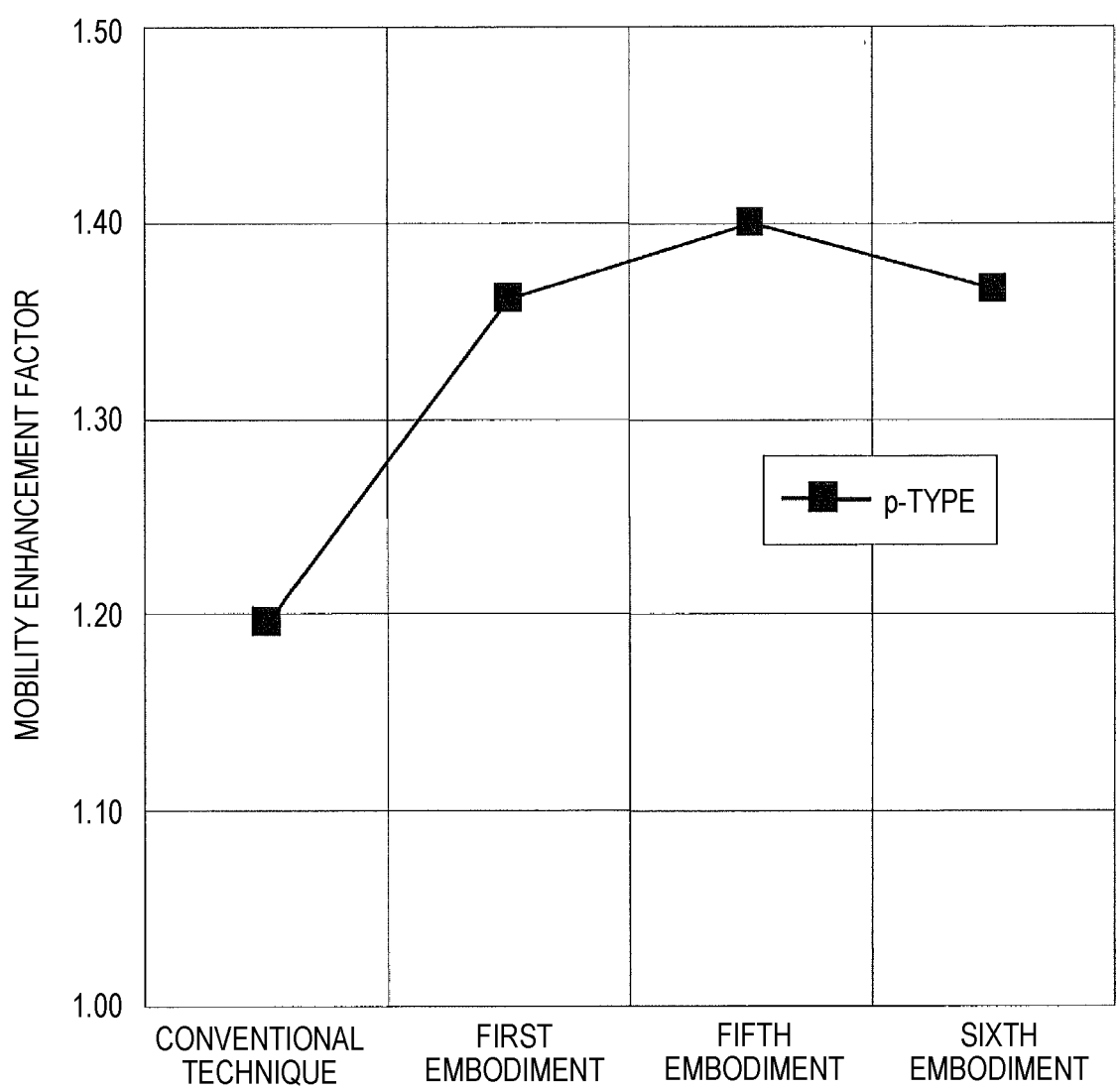

[FIG. 25]
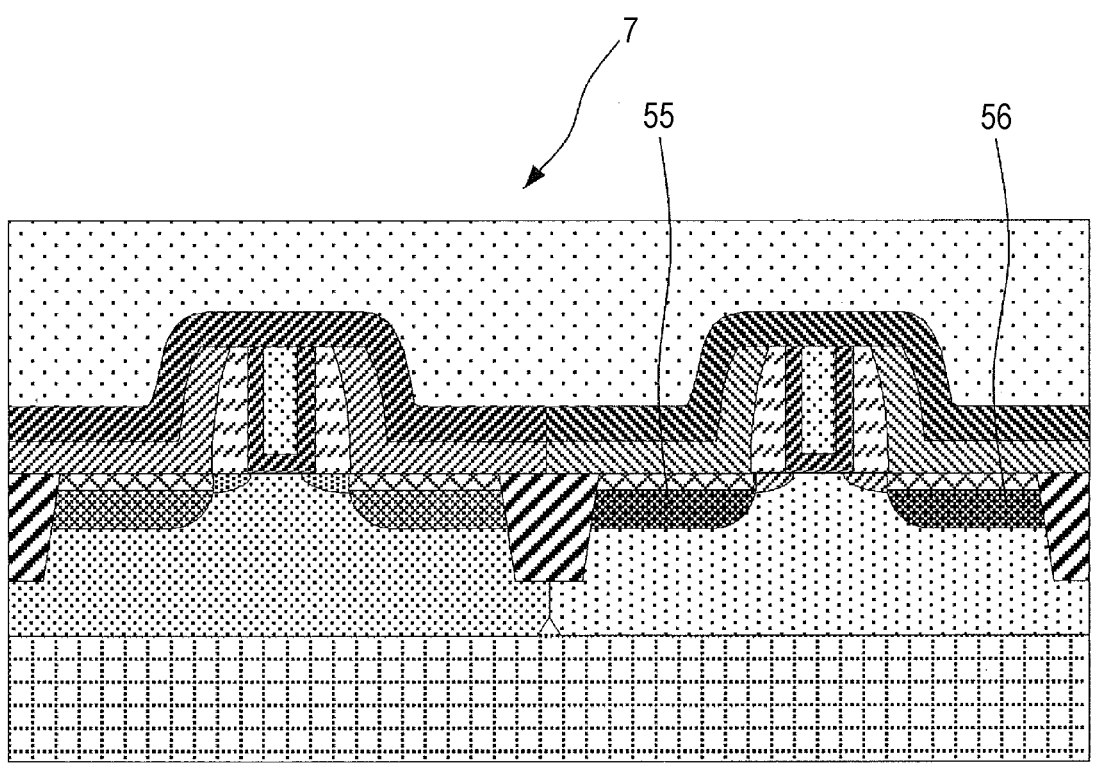

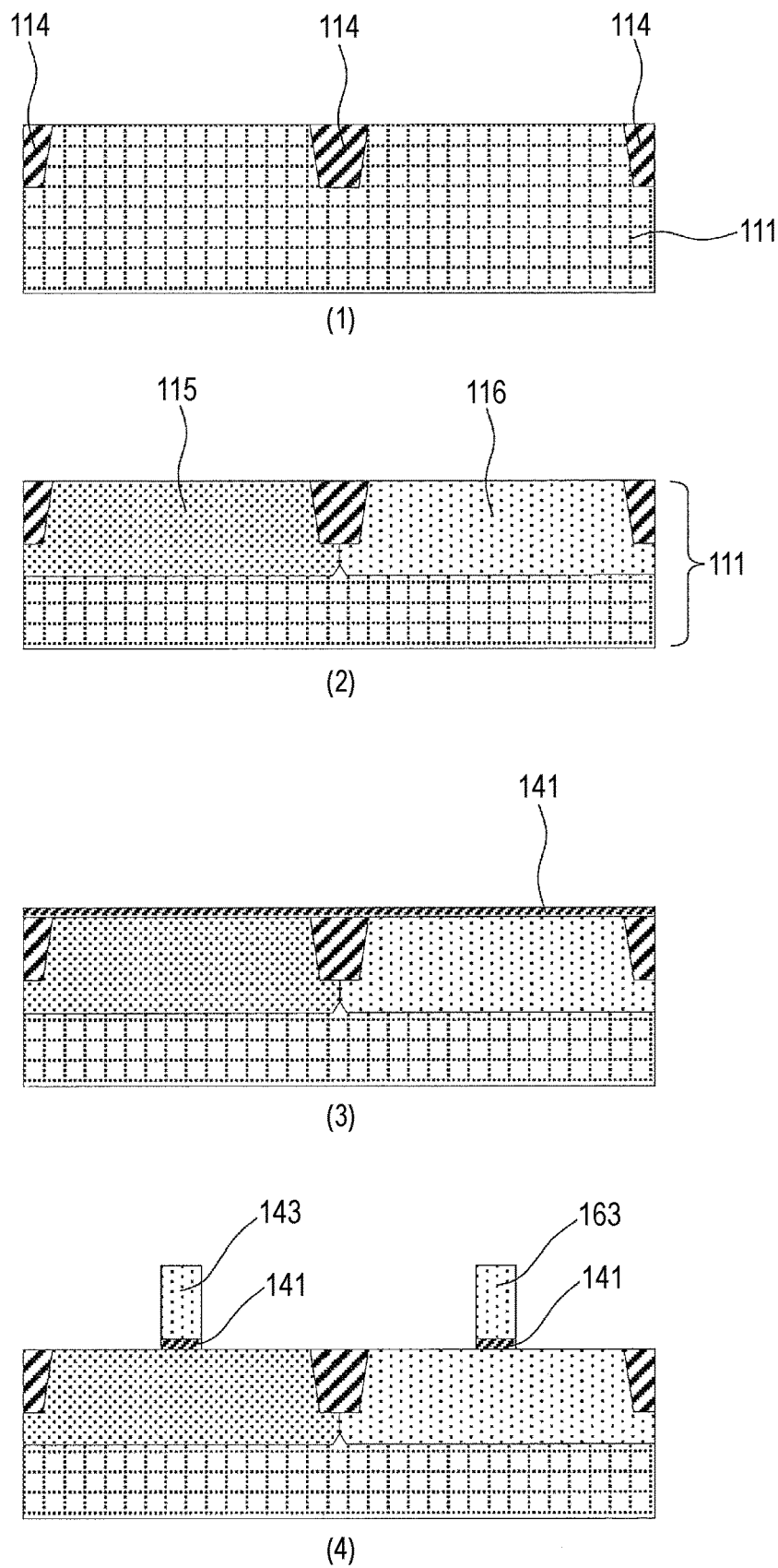
[FIG. 26]

[FIG. 27]
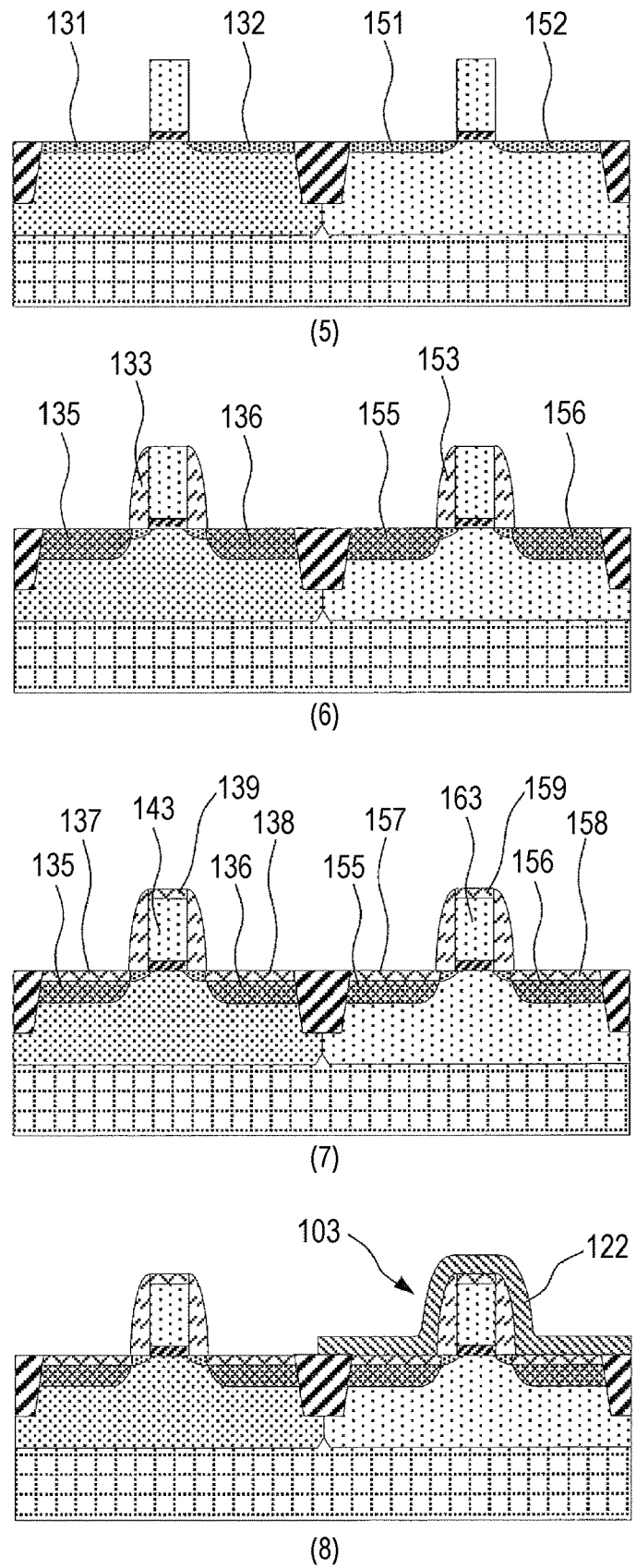

[FIG. 28]
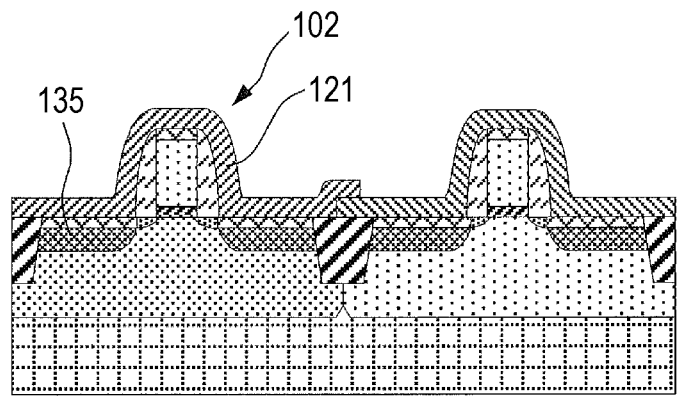
(9)
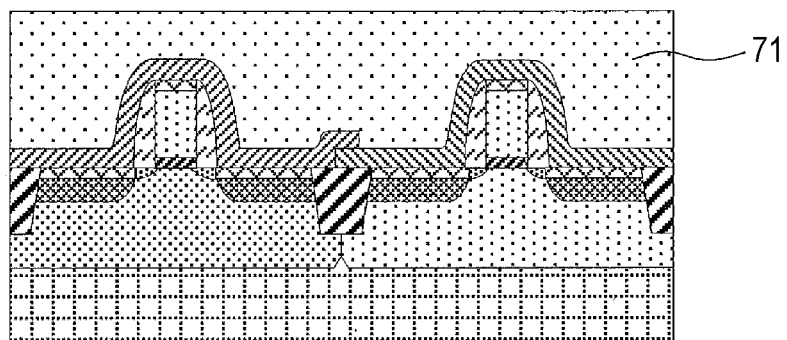
(10)
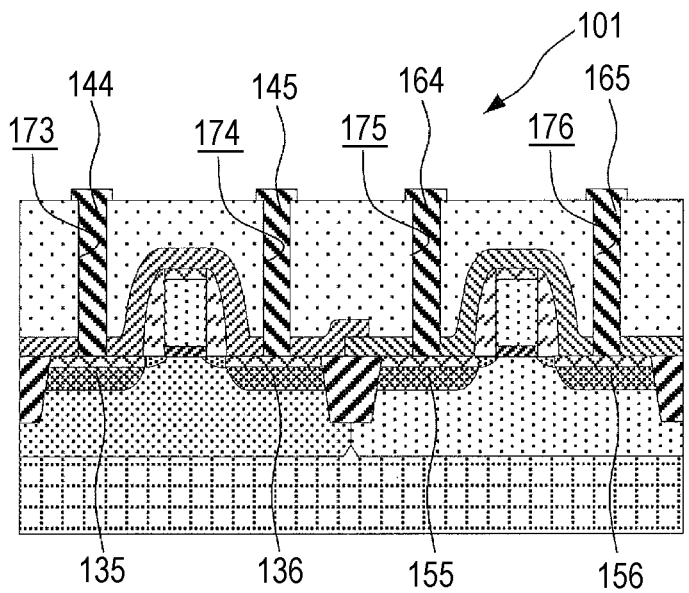
(11)

SEMICONDUCTOR DEVICE AND METHOD OF MANUFACTURING THE SAME

RELATED APPLICATION DATA

This application is a continuation of U.S. patent application Ser. No. 15/852,041, filed Dec. 22, 2017, which is a continuation of U.S. patent application Ser. No. 15/154,365, filed May 13, 2016, now U.S. Pat. No. 9,881,920, issued on Jan. 30, 2018, which is a continuation of U.S. patent application Ser. No. 14/669,803 filed Mar. 26, 2015, now U.S. Pat. No. 9,449,974, issued on Sep. 20, 2016, which is a continuation of U.S. patent application Ser. No. 12/530,797 filed Sep. 11, 2009, now U.S. Pat. No. 9,070,783 issued Jun. 30, 2015 which is the Section 371 National Stage of PCT/JP2008/053424 filed Feb. 27, 2008 the entireties of which are incorporated herein by reference to the extent permitted by law. The present application claims the benefit of priority to Japanese Patent Application Nos. 2007-072968 filed on Mar. 20, 2007 and 2008-018513 filed Jan. 30, 2008 in the Japan Patent Office, the entireties of which are incorporated by reference herein to the extent permitted by law.

TECHNICAL FIELD

The present invention relates to a semiconductor device with stress applied to a transistor channel and a method of manufacturing the same.

BACKGROUND ART

These years, semiconductor integrated circuits have achieved a higher level of integration, higher speed, and lower power consumption, and there has been an increasing demand for improving the quality of transistors. There are various methods of enhancing the ability of a transistor. Especially, a method of raising the mobility of carriers by applying a proper stress on a semiconductor device, with a stressed thin film layered on the surface thereof, is in widespread use because it is free from side effects, such as a capacity increase, in a transistor having a gate length of 100 nm or less (for example, refer to JP-A-2002-198368, JP-A-2005-57301, JP-A-2006-165335, and JP-A-2006-269768).

The conventional method of manufacturing a transistor using a stress applying film will be described with reference to the manufacturing processes in FIGS. 26 to 28.

As illustrated in FIG. 26(1), an element isolating region 114 of the STI (Shallow Trench Isolation) structure is formed on a silicon substrate 111.

Next, as illustrated in FIG. 26(2), a silicon oxide film (not illustrated) is formed through surface oxidation as a protective film for channeling prevention when the impurities are ion-implanted in the silicon substrate 111. Then, the impurities are ion-implanted respectively in the n-type transistor area and the p-type transistor area, thus forming a p-type well region 115 and an n-type well region 116.

Then, the protective silicon oxide film is removed and a gate oxide film 141 is newly formed in a thickness of about 1 to 3 nm as illustrated in FIG. 26(3).

Next, as illustrated in FIG. 26(4), after a polysilicon film is formed on the gate oxide film 141 with a film thickness of about 100 to 150 nm, a photolithography technique and a dry etching technique are used to form gate electrodes 143 and 163 with a polysilicon film.

Next, as illustrated in FIG. 27(5), through impurity implantation, n-type extension regions 131 and 132 are formed in the n-type transistor region through implantation of n-type impurities, such as As ions, P ions, and the like, while p-type extension regions 151 and 152 are formed in the p-type transistor region through implantation of p-type impurities, such as B ions and so on.

Next, as illustrated in FIG. 27(6), after gate side wall insulating films 133 and 153, including a silicon nitride film or oxide film with a thickness of about 20 nm to 50 nm, are formed according to the CVD method and the dry etching method, impurity ions are implanted, to form source/drain regions 135 and 136 in the n-type transistor region and source/drain regions 155 and 156 in the p-type transistor region. Then, by applying heat at a temperature of about 1050° C. instantaneously, the impurities are activated.

Next, as illustrated in FIG. 27(7), silicide electrodes 137, 138, 157, 158, 139, and 159 with thicknesses of about 20 nm to 50 nm are formed on the source/drain regions 135, 136, 155, and 156 and the gate electrodes 143 and 163 using cobalt (Co), nickel (Ni) or the like, according to salicide process technology, hence to reduce resistance there.

Next, as illustrated in FIG. 28(8), a compressive liner film 122 formed of a silicon nitride film having a compressive stress of about 1 GPa to 3 GPa, is formed on p-type transistor 103 in a thickness of about 20 nm to 60 nm according to the CVD method, optical lithographymethod, and dry etching method.

Further, as illustrated in FIG. 28(9), a tensile liner film 121 formed of a silicon nitride film having a tensile stress of about 1 GPa to 2 GPa, is formed on n-type transistor 102 through the CVD method, optical lithography method, and dry etching method. Due to the effect of this liner film, a compressive stress is applied to a channel of the p-type transistor in the direction of the channel to improve the mobility of holes and a tensile stress is applied to a channel of the n-type transistor to improve the mobility of electrons.

Next, as illustrated in FIG. 28(10), an interlayer insulating film 171 formed of silicon oxide ($SiO_2$) or the like is formed through the CVD method. Further, after a contact hole is bored according to the dry etching technique, metal of tungsten (W) or the like is embedded to form contact electrodes 144, 145, 164, and 165 which connect to the source/drain regions 135, 136, 155, and 156, thereby a transistor 101 is completed.

In the conventional transistor structure, by forming a stressed thin film on the completed transistor device, it is possible to apply a stress on the device and improve the mobility of the transistor comparatively easily; however, there is a problem in that only a small stress is imposed on the channel of the transistor, compared with the stress of the thin film, because of the repulsive force from the gate electrodes. In order to impose a large stress there, it is necessary to get the film thicker or to get the internal stress itself of the film larger. When the film gets thicker, however, there are some problems, namely, it comes into contact with the adjacent transistor portion, which decreases the effect of stress, and boring a contact hole becomes difficult because a portion of the silicon nitride film becomes thicker. Further, when the internal stress of the film gets larger, there is a problem in that defects of the film, such as cracks, occur.

The problem to be solved is that, in the structure of forming a thin film having a stress on a transistor device, only a small stress can be applied on the channel of the transistor, compared with the stress of the thin film, because of the repulsive force from the gate electrodes.

The present invention aims to enhance a current increasing effect by increasing a stress to be applied on the transistor channel.

Disclosure of the Invention

The present invention according to claim 1 is characterized by comprising: a side wall insulating film which is formed on a semiconductor substrate with a trench formed by removing a dummy gate; a gate electrode which is formed on the semiconductor substrate within the trench through a gate insulating film; a stress applying film which is formed along the side wall insulating film over the semiconductor substrate; and source/drain regions which are formed in the semiconductor substrate on the both sides of the gate electrode, in that the stress applying film is formed before the trench is formed.

In the invention according to claim 1, since the stress applying film is formed before the trench is formed, the dummy gate is removed in such a state that a stress is applied on the semiconductor substrate owing to the stress applying film. Therefore, the stress which has been applied on the dummy gate comes to be applied on the semiconductor substrate of the region where the dummy gate is removed, namely, a transistor channel region, thereby a stress to be applied on the channel region increases.

The invention according to claim 5 is characterized by comprising: an n-type transistor, in an n-type transistor forming region of the semiconductor substrate, having a side wall insulating film which is formed on the semiconductor substrate with a first trench formed by removing a first dummy gate, a gate electrode which is formed on the semiconductor substrate within the second trench through a gate insulating film, a first stress applying film having a tensile stress which is formed along the side wall insulating film over the semiconductor substrate, and source/drain regions which are formed in the semiconductor substrate on the both sides of the gate electrode; and a p-type transistor, in a p-type transistor forming region of the semiconductor substrate, having a side wall insulating film which is formed on the semiconductor substrate with the second trench formed by removing a second dummy gate, a gate electrode which is formed on the semiconductor substrate within the second trench through the gate insulating film, a second stress applying film having a compressive stress which is formed along the side wall insulating film over the semiconductor substrate, and source/drain regions which are formed in the semiconductor substrate on the both sides of the gate electrode, in that the first stress applying film is formed before the first trench is formed, and the second stress applying film is formed before the second trench is formed.

In the invention according to claim 5, since the first stress applying film is formed before the first trench is formed and the second stress applying film is formed before the second trench is formed, the dummy gates are removed in such a state that stresses are applied on the semiconductor substrate owing to the respective stress applying films. Therefore, the stresses which have been applied on the dummy comes to be applied on the semiconductor substrate of the regions where the dummy gates are removed, namely, transistor channel regions, thereby increasing stresses to be applied on the channel regions.

The invention according to one embodiment is characterized by comprising: a process of forming a dummy gate on semiconductor substrate, thereafter forming a side wall insulating film on each side wall of the dummy gate, and forming source/drain regions in the semiconductor substrate on the both sides of the dummy gate; a process of forming a stress applying film along the side wall insulating film over the semiconductor substrate; a process of forming a trench by removing the dummy gate; and a process of forming a gate electrode on the semiconductor substrate within the trench through a gate insulating film.

In the invention according to this embodiment, since the stress applying film is formed before the trench is formed, the dummy gate is removed in such a state that the stress is applied on the semiconductor substrate owing to the stress applying film. Therefore, the stress which has been applied on the dummy gate comes to be applied on the semiconductor substrate of the region where the dummy gate is removed, namely, a transistor channel region, thereby a stress to be applied on the channel region increases.

The invention according to another embodiment is characterized by comprising: a process of forming each dummy gate in an n-type transistor forming region and a p-type transistor forming region on semiconductor substrate, thereafter forming a side wall insulating film on the side walls of the respective dummy gates, and forming source/drain regions respectively in the semiconductor substrate on the both sides of the respective dummy gates; a process of forming a first stress applying film along the side wall insulating film over the semiconductor substrate in the p-type transistor forming region; a process of forming a second stress applying film along the side wall insulating film over the semiconductor substrate in the p-type transistor forming region; a process of forming trenches by removing the respective dummy gates; and a process of forming gate electrodes on the semiconductor substrate within the respective trenches through a gate insulating film.

In the invention according to another enbodiment, since the first stress applying film is formed before the first trench is formed and the second stress applying film is formed before the second trench is formed, the dummy gates are removed in such a state that stresses are applied on the semiconductor substrate owing to the respective stress applying films. Therefore, the stresses which have been applied on the dummy gates comes to be applied on the semiconductor substrate of the regions where the dummy gates are removed, namely, transistor channel regions, thereby increasing stresses to be applied on the transistor channel regions.

According to the invention, since the stress applied on the channel region of the transistor increases, mobility can be increased extremely, thereby improving the response performance of a transistor advantageously.

BRIEF DESCRIPTION OF THE DRAWINGS

FIG. 1 is a schematic cross sectional structural view showing an embodiment (first embodiment) of a semiconductor device according to the invention.

FIG. 2 is a cross sectional view of a manufacturing process showing the embodiment (first embodiment) of a method of manufacturing the semiconductor device according to the invention.

FIG. 3 is a cross sectional view of a manufacturing process showing the embodiment (first embodiment) of the method of manufacturing the semiconductor device according to the invention.

FIG. 4 is a cross sectional view of a manufacturing process showing the embodiment (first embodiment) of the method of manufacturing the semiconductor device according to the invention.

FIG. 5 is a cross sectional view of a manufacturing process showing the embodiment (first embodiment) of the method of manufacturing the semiconductor device according to the invention.

FIG. 6 is a cross sectional view of a manufacturing process showing the embodiment (first embodiment) of the method of manufacturing the semiconductor device according to the invention.

FIG. 7 is a cross sectional view of a manufacturing process showing the embodiment (first embodiment) of the method of manufacturing the semiconductor device according to the invention.

FIG. 8 is a view for use in describing effects of a stress increase in the n-type transistor according to the first embodiment.

FIG. 9 is a view for use in describing effects of a stress increase in the p-type transistor according to the first embodiment.

FIG. 10 is a view for use in describing effects of mobility enhancement in the n-type and p-type transistors according to the first embodiment.

FIG. 11 is a schematic cross sectional structural view showing another embodiment (second embodiment) of a semiconductor device according to the invention.

FIG. 12 is a cross sectional view of a manufacturing process showing the embodiment (second embodiment) of a method of manufacturing the semiconductor device according to the invention.

FIG. 13 is a cross sectional view of a manufacturing process showing the embodiment (second embodiment) of the method of manufacturing the semiconductor device according to the invention.

FIG. 14 is a view for use in describing effects of a stress increase in the n-type transistor according to the second embodiment.

FIG. 15 is a view for use in describing effects of a stress increase in the p-type transistor according to the second embodiment.

FIG. 16 is a view for use in describing effects of mobility enhancement in the n-type and p-type transistors according to the second embodiment.

FIG. 17 is a schematic cross sectional structural view showing another embodiment (third embodiment) of a semiconductor device according to the invention.

FIG. 18 is a schematic cross sectional structural view showing another embodiment (fourth embodiment) of a semiconductor device according to the invention.

FIG. 19 is a view for use in describing effects of a stress increase in the p-type transistor according to the third and the fourth embodiments.

FIG. 20 is a view for use in describing effects of mobility enhancement in the p-type transistor according to the third and the fourth embodiments.

FIG. 21 is a schematic cross sectional structural view showing another embodiment (fifth embodiment) of a semiconductor device according to the invention.

FIG. 22 is a schematic cross sectional structural view showing another embodiment (sixth embodiment) of a semiconductor device according to the invention.

FIG. 23 is a view for use in describing effects of a stress increase in the p-type transistor according to the fifth and the sixth embodiments.

FIG. 24 is a view for use in describing effects of mobility enhancement in the p-type transistor according to the fifth and sixth embodiments.

FIG. 25 is a schematic cross sectional structural view showing another embodiment (seventh embodiment) of a semiconductor device according to the invention.

FIG. 26 is a cross sectional view of a manufacturing process showing one example of a method of manufacturing a semiconductor device according to the conventional technique.

FIG. 27 is a cross sectional view of a manufacturing process showing the example of the method of manufacturing a semiconductor device according to the conventional technique.

FIG. 28 is a cross sectional view of a manufacturing process showing the example of the method of manufacturing a semiconductor device according to the conventional technique.

BEST MODE FOR CARRYING OUT THE INVENTION

One embodiment (first embodiment) of a semiconductor device according to the invention will be described with reference to the schematic cross sectional structural view in FIG. 1.

As illustrated in FIG. 1, element isolating regions 14 which separate an n-type transistor forming region 12 and a p-type transistor forming region 13 electrically, are formed on a semiconductor substrate 11. For example, silicon substrate is used for the semiconductor substrate 11 and the element isolating region 14 is formed, for example, in the STI (Shallow Trench Isolation) structure including, for example, an oxide film.

A p-type well region 15 with p-type impurities induced, is formed in the semiconductor substrate 11 of the n-type transistor forming region 12, and an n-type well region 16 with n-type impurities induced, is formed in the semiconductor substrate 11 of the p-type transistor forming region 13.

On the semiconductor substrate 11, a side wall insulating film 33 having a first trench 39 which is formed by removing the first dummy gate (not illustrated), is formed in the n-type transistor forming region 12 and a side wall insulating film 53 having a second trench 59 which is formed by removing the second dummy gate (not illustrated), is formed in the p-type transistor forming region 13. The side wall insulating films 33 and 53 are formed, for example, in thicknesses of about 20 nm to 50 nm.

A gate electrode 43 is formed within the first trench 39 through the gate insulating film 41 on the semiconductor substrate 11 and a gate electrode 63 is formed inside the second trench 59 through the gate insulating film 41 on the semiconductor substrate 11.

The gate insulating film 41 is formed, for example, of a hafnium oxide ($HfO_2$) film, an insulating film of high dielectric constant (High-k), with a thickness of about 2 nm to 3 nm. Although this embodiment adopts $HfO_2$, another High-k material, such as HfSiO, tantalum oxide ($Ta_2O_5$), hafnium aluminum oxide ($HfAlO_x$), or the like, may be used, or the surface of the semiconductor substrate 11, e.g. the silicon surface, may be simply oxidized as the gate insulating film 41. Alternatively, a high dielectric constant (High-k) insulating film may be previously formed on the surface of the semiconductor substrate 11 and may be used as such.

The gate electrodes 43 and 63 are formed, for example, by a metal compound layer or a metal layer. As an example, titanium nitride (TiN) is used here. As the metal layer, tungsten (W), titanium (Ti), titanium nitride (TiN), hafnium (Hf), hafnium silicide (HfSi), ruthenium (Ru), iridium (Ir), cobalt (Co), or the like, may be selected. Although the embodiment adopts a single layer, a plurality of metal films may be layered in order to reduce resistance and adjust the threshold voltage.

Extension regions 31 and 32 are formed in the semiconductor substrate 11 on the both sides of the first trench 39 in the n-type transistor forming region 12. Further, source/drain regions 35 and 36 are formed in the semiconductor substrate 11 on the both sides of the first trench 39 through the respective extension regions 31 and 32. As n-type impurities, phosphorus (P) or arsenic (As) are induced in the extension regions 31 and 32 and the source/drain regions 35 and 36.

Further, in the p-type transistor forming region 13, extension regions 51 and 52 are formed in the semiconductor substrate 11 on the both sides of the second trench 59. Further, source/drain regions 55 and 56 are formed in the semiconductor substrate 11 on the both sides of the second trench 59 through the respective extension regions 51 and 52. As p-type impurities, boron (B), indium (In), or the like are induced into the extension regions 51 and 52 and the source/drain regions 55 and 56.

Silicide electrodes 37 and 38 are formed on the source/drain regions 35 and 36 and silicide electrodes 57 and 58 are formed on the source/drain regions 55 and 56, thereby reducing resistance in the respective source/drain regions. The silicide electrodes 37, 38, 57, and 58 are respectively formed of a silicide layer containing, for example, cobalt (Co), nickel (Ni), platinum (Pt) or their compound with a thickness of about 20 nm to 50 nm.

In the n-type transistor forming region 12, a first stress applying film 21 having a tensile stress is formed along the side wall insulating film 33 on semiconductor substrate 11, while in the p-type transistor forming region 13, a second stress applying film 22 having a compressive stress is formed along the side wall insulating film 53 on the semiconductor substrate 11. In this way, it is characterized in that the first stress applying film 21 is formed before the first trench 39 is formed and that the second stress applying film 22 is formed before the second trench 59 is formed.

The first stress applying film 21 is formed, for example, of a silicon nitride film having a tensile stress with a film thickness of about 40 nm. Although a film having a tensile stress of about 1.2 GPa is formed in the embodiment, the stress is not restricted to this value. A film thickness is not restricted to the above film thickness of the embodiment.

Further, the second stress applying film 22 is formed, for example, of a silicon nitride film having a compressive stress with a film thickness of about 40 nm. Although a film having a compressive stress of 1.2 GPa is formed in the embodiment, the stress is not restricted to this value. A film thickness is not restricted to the above film thickness of the embodiment.

Further, a first interlayer insulating film 71 and a second interlayer insulating film 72 are formed on the whole surface of the semiconductor substrate 11. These first and second interlayer insulating films 71 and 72 are formed, for example, of a silicon oxide ($SiO_2$) film.

Contact holes 73, 74, 75, and 76 which communicate with the source/drain regions 35, 36, 55, and 56, are formed in the second interlayer insulating film 72 and the first interlayer insulating film 71, and source/drain electrodes 44, 45, 64, and 65 with metal such as tungsten (W) and so on embedded are formed. A semiconductor device 1 including n-type transistor Tr1 and p-type transistor Tr2 is constructed in this way.

Next, an embodiment (first embodiment) of a method of manufacturing a semiconductor device according to the invention will be described with reference to the cross sectional views of manufacturing processes in FIGS. 2 to 7. Here, a method of manufacturing the semiconductor device, according to the first embodiment, will be described.

As illustrated in FIG. 2(1), element isolating regions 14 which electrically separate the n-type transistor forming region 12 and the p-type transistor forming region 13 are formed in the semiconductor substrate 11. The above semiconductor substrate 11 adopts, for example, silicon substrate and the element isolating region 14 is formed in the STI (Shallow Trench Isolation) structure formed, for example, of an oxide film.

Next, as illustrated in FIG. 2(2), a protective film 80 for channeling prevention at the ion implantation is formed on the semiconductor substrate 11. The protective film 80 is formed, for example, of a silicon oxide film with a thickness of about 5 nm to 10 nm. Its forming method adopts, for example, surface oxidation. Next, after ion implantation mask (not illustrated) which covers the p-type transistor forming region is formed, the p-type impurities are induced in the semiconductor substrate 11 of the n-type transistor forming region 12, according to the ion implantation method, to form a p-type well region 15.

Thereafter, the above ion implantation mask is removed.

Next, after ion implantation mask (not illustrated) which covers the n-type transistor forming region 12 is formed, the n-type impurities are induced in the semiconductor substrate 11 of the p-type transistor forming region 13, according to the ion implantation method, to form an n-type well region 16.

Thereafter, the above ion implantation mask is removed. Further, the protective film 80 is removed.

Whichever of the p-type well region 15 and the n-type well region 16 may be formed first.

Next, as illustrated in FIG. 2(3), a dummy gate insulating film 81, a dummy gate forming film 82, and a hard mask layer 83 are formed sequentially on the semiconductor substrate 11.

The dummy gate insulating film 81 is formed, for example, of an oxide film with a thickness of about 1 nm to 3 nm. The method of forming the film adopts, for example, the thermal oxidation process.

The dummy gate forming film 82 is formed, for example, of a polysilicon film with a thickness of about 100 nm to 150 nm. Its forming method adopts, for example, the CVD method and so on. Although the dummy gate insulating film is removed in the post-process in the embodiment, for example, a gate insulating film may be formed at this stage in some cases. For example, the gate insulating film may use a high dielectric constant (High-k) insulating film of hafnium oxide ($HfO_2$) or the like. The dummy gate forming film 82 may adopt an amorphous silicon film.

The hard mask layer 83 uses, for example, a silicon nitride film with a thickness of about 30 nm to 100 nm. The film formation method adopts, for example, the CVD method.

Then, resist (not illustrated) is patterned on the hard mask layer 83 through the optical lithography technique or the electron beam lithography technique, to form a resist mask pattern (not illustrated) for forming gate electrodes of a transistor. With the resist mask pattern as a mask, the hard mask layer 83 is etched through the dry etching method or the like. After the etching, the resist mask pattern is removed and with the remaining hard mask layer 83 as an etching mask, the dummy gate forming film 82 and the dummy gate insulating film 81 are etched again through the dry etching method or the like.

As the result, as illustrated in FIG. 3(4), the dummy gates 84 and 85 are formed on the semiconductor substrate 11.

It is preferable that the dry etching is performed with such a selection ratio as to etch almost none of the hard mask layer 83.

Next, as illustrated in FIG. 3(5), in the n-type transistor forming region 12, the extension regions 31 and 32 are formed in the semiconductor substrate 11 of the n-type transistor forming region 12 on the both sides of the dummy gate 84.

In the p-type transistor forming region 13, the extension regions 51 and 52 are formed in the semiconductor substrate 11 of the p-type transistor forming region 13 on the both sides of the dummy gate 85.

More specifically, after forming ion implantation mask (not illustrated) which covers the p-type transistor forming region 13, according to the ion implantation method, the n-type impurities are induced in the semiconductor substrate 11 of the n-type transistor forming region 12 on the both sides of the dummy gate 84, to form the extension regions 31 and 32. In this ion implantation, for example, phosphorus (P), arsenic (As), or the like, is used as the n-type impurities. Further, for example, a resist film is used as ion implantation mask of the n-type impurities. Thereafter, the above ion implantation mask is removed.

Then, after forming the ion implantation mask (not illustrated) which covers the n-type transistor forming region 12, the p-type impurities are induced in the semiconductor substrate 11 of the p-type transistor forming region 13 on the both sides of the dummy gate 85 according to the ion implantation method, hence to form the extension regions 51 and 52. In this ion implantation, for example, boron (B), indium (In), or the like, is used as the n-type impurities. Further, for example, a resist film is used for the ion implantation mask of the p-type impurities.

Thereafter, the ion implantation mask is removed.

Before impurities are implanted in the respective extension regions 31, 32, 51, and 52, the respective side walls of the dummy gates 84 and 85 may be protected by a side wall protective film, such as a silicon nitride film, a silicon oxide film, and so on.

Next, as illustrated in FIG. 3(6), the side wall insulating films 33 and 53 are respectively formed on the respective side walls of the dummy gates 84 and 85. The side wall insulating films 33 and 53 are formed, for example, in thicknesses of about 20 nm to 50 nm.

Thereafter, the source/drain regions 35 and 36 are formed in the semiconductor substrate 11 on the both sides of the dummy gate 84 through the respective extension regions 31 and 32.

Similarly, the source/drain regions 55 and 56 are formed in the semiconductor substrate 11 on the both sides of the dummy gate 85 through the respective extension regions 51 and 52.

The source/drain regions 35 and 36 are formed by ion-implanting, for example, the n-type impurities in the semiconductor substrate 11 after ion implantation mask (not illustrated) is formed in the p-type transistor forming region.

Next, the above ion implantation mask is removed.

Further, the source/drain regions 55 and 56 are formed by ion-implanting, for example, the p-type impurities in the semiconductor substrate 11 after ion implantation mask (not illustrated) is formed in the n-type transistor forming region.

Next, the above ion implantation mask is removed.

Thereafter, activation annealing is performed to activate the impurities implanted in the extension regions 31, 32, 51, and 52 and the source/drain regions 35, 36, 55, and 56. The activation annealing is performed, for example, by rapid thermal annealing (RTA) at about 1000° C. to 1100° C.

Next, as illustrated in FIG. 4(7), according to the salicide process technology, the silicide electrodes 37 and 38 are formed on the source/drain regions 35 and 36 and the silicide electrodes 57 and 58 are formed on the source/drain regions 55 and 56, hence to reduce resistance in the respective source/drain regions. In the salicide process technology, a silicide layer with a thickness of about 20 nm to 50 nm is formed of cobalt (Co), nickel (Ni), platinum (Pt) or their compound.

Next, as illustrated in FIG. 4(8), a second stress applying film (Compressive liner film) 22 having a compressive stress is formed on the whole surface. This stress applying film 22 is formed of a silicon nitride film having a compressive stress of about 1.2 GPa with a film thickness of 40 nm according to the plasma CVD method.

The second stress applying film 22 is formed by supplying hydrogen ($H_2$) gas (1000 cm$^3$/min to 5000 cm$^3$/min), nitrogen ($N_2$) gas (500 cm$^3$/min to 2500 cm$^3$/min), argon (Ar) gas (1000 cm$^3$/min to 5000 cm$^3$/min), ammonia ($NH_3$) gas (50 cm$^3$/min to 200 cm$^3$/min), trimethyl silane gas (10 cm$^3$/min to 50 cm$^3$/min) for chemical reaction under the conditions of a substrate temperature of 400° C. to 600° C., a pressure of 0.13 kPa to 0.67 kPa, and RF power of 50 W to 500 W.

Although a film having a compressive stress of 1.2 GPa is formed in the embodiment, the stress is not restricted to this value. A film thickness is not restricted to the above film thickness of the embodiment, either.

Thereafter, the optical lithography technique and the dry etching technique are used to process the second stress applying film 22 so that just only on the p-type transistor forming region 13 is left.

Next, as illustrated in FIG. 4(9), a first stress applying film (Tensile liner film) 21 having a tensile stress is formed on the whole surface. This first stress applying film 21 is formed of a silicon nitride film having a tensile stress of about 1.2 GPa with a film thickness of about 40 nm according to the plasma CVD method.

The first stress applying film 21 is formed by supplying nitrogen ($N_2$) gas (500 cm$^3$/min to 2000 cm$^3$/min), ammonia ($NH_3$) gas (500 cm$^3$/min to 1500 cm$^3$/min), and monosilane ($SiH_4$) gas (50 cm$^3$/min to 300 cm$^3$/min) for chemical reaction under the conditions of a substrate temperature of 200° C. to 400° C., a pressure of 0.67 kPa to 2.0 kPa, and RF power of 50 W to 500 W. Further, after the film formation, helium (He) gas (10 L/min to 20 L/min) is supplied and ultraviolet (UV) irradiation process is performed under the conditions of a temperature of 400° C. to 600° C., a pressure of 0.67 kPa to 2.0 kPa, and ultraviolet (UV) lamp power of 1 kW to 10 kW.

Although a film having a tensile stress of 1.2 GPa is formed in the embodiment, the stress is not restricted to this value. Further, a film thickness is not restricted to the above film thickness of the embodiment.

Thereafter, the optical lithography technique and the dry etching technique are used to process the first stress applying film 21 so that just only on the n-type transistor forming region 12 is left. Whichever of the first and second stress applying films 21 and 22 may be formed first.

Next, as illustrate in FIG. 5(10), the first interlayer insulating film 71 is formed on the whole surface of the semiconductor substrate 11. This first interlayer insulating film 71 is formed, for example, of a silicon oxide (SiO$_2$) film.

Next, as illustrate in FIG. 5(11), the surface portion of the first interlayer insulating film 71 is removed so that the tops of the respective dummy gates 84 and 85 are exposed. In this removing process, the surface of the first interlayer insulating film 71 is polished, for example, according to the CMP method. Then, the tops of the respective dummy gates 84 and 85 are exposed.

Next, as illustrated in FIG. 5(12), the dummy gates 84 and 85 (refer to FIG. 5(11)) are removed. This removing process is performed through dry etching. Continuously, the silicon oxide film of the dummy gate insulating film 81 is removed through wet etching using hydrofluoric acid, to form the trenches 39 and 59. Thus, the trenches 39 and 59 are formed within the side wall insulating films 33 and 53.

Next, as illustrated in FIG. 6(13), the gate insulating film 41 is formed on the surface of the first interlayer insulating film 71 including the inner surfaces of the trenches 39 and 59. This gate insulating film 41 is formed, for example, of a hafnium oxide (HfO$_2$) film, a high dielectric constant (High-k) insulating film with a thickness of about 2 nm to 3 nm, according to the CVD method and so on. Although the embodiment adopts HfO$_2$, another High-k material, such as HfSiO, tantalum oxide (Ta$_2$O$_5$), hafnium aluminum oxide (HfAlO$_x$), or the like, may be used, or the surface of the semiconductor substrate 11, e.g. the silicon surface, may be simply oxidized as the gate insulating film 41. Alternatively, a high dielectric constant (High-k) insulating film may be previously formed on the surface of the semiconductor substrate 11 and may be used as such.

As illustrated in FIG. 6(14), a gate electrode forming layer 42 is embedded in the trenches 39 and 59 through the gate insulating film 41. This gate electrode forming layer 42 uses, for example, a metal compound layer or a metal layer. Here, as one example, titanium nitride (TiN) is used. A method of forming the gate electrode forming layer 42 adopts, for example, an ALD method (Atomic Layer Deposition) or a PVD method (Physical Vapor Deposition). The embodiment adopts a titanium nitride (TiN) film having a compressive stress through the PVD method. As the metal layer, tungsten (W), titanium (Ti), titanium nitride (TiN), hafnium (Hf), hafnium silicide (HfSi), ruthenium (Ru), iridium (Ir), cobalt (Co), or the like, can be selected. Although the embodiment adopts a single layer film, a plurality of metal films may be layered in order to reduce resistance and adjust the threshold voltage.

As illustrated in FIG. 6 (15), the surplus gate electrode forming layer 42 and gate insulating film 41 on the first interlayer insulating film 71 are removed such that the gate electrode forming layer 42 is embedded in the trenches 39 and 59, hence to form the gate electrodes 43 and 63. This removing process adopts, for example, the CMP, in which the above layer is polished so that the surface of the first interlayer insulating film 71 is exposed.

Next, as illustrated in FIG. 7 (16), the second interlayer insulating film 72 is formed on the first interlayer insulating film 71. The second interlayer insulating film 72 is formed, for example, of a silicon oxide (SiO$_2$) film. After the contact holes 73, 74, 75, and 76 which communicate with the source/drain regions 35, 36, 55, and 56, are bored in the second interlayer insulating film 72 and the first interlayer insulating film 71 through the dry etching technique, metal including tungsten (W) and so on is embedded to form the source/drain electrodes 44, 45, 64, and 65, hence to complete a semiconductor device 1 including the n-type transistor Tr1 and the p-type transistor Tr2.

Next, the increasing effect of a stress in the above first embodiment will be described with reference to FIGS. 8 to 10. FIGS. 8 to 10 show the results of stress simulation performed according to the structure of the above first embodiment.

FIG. 8 shows the stress in a channel of the n-type transistor in the respective processes in the conventional technique and the first embodiment of the invention. This simulation assumes a gate length of 60 nm. Also, in this simulation, an x-axis is defined as the direction from source to drain (direction of transistor gate length (L)), a y-axis is defined as the direction of substrate depth from the gate electrode, and a z-axis is defined as the direction from the frontward to the backward (direction of gate width (W) of transistor), and the reference symbols Sxx, Syy, and Szz indicate the main stress components toward the respective directions. A stress in a channel indicates the value at a depth of 1 nm from the surface of the silicon substrate in the central portion of the gate. In FIGS. 8 to 10, "conventional technique" shows the stress value in the state of FIG. 28(10); "after dummy gate removal" shows the stress value just after the removal of the dummy gate according to the embodiment; "after dummy gate and dummy oxide film removal" shows the stress value just after the removal of the dummy gate and the dummy gate insulating film (FIG. 5(12)) according to the embodiment; and "after gate electrode formation" shows the stress value just after forming the gate electrodes 43 and 63 (FIG. 6(15)), and in each case, the values of Sxx, Syy, and Szz are shown. The stress value of plus (+) indicates a tensile stress, and the value of minus (−) indicates a compressive stress.

According to the above simulation results, it is found that the value of Sxx extremely increases just after the removal of the dummy gate compared with the conventional technique. This shows that the stress applied from the stressed (stress liner) film is not applied on the semiconductor substrate (silicon substrate) effectively, due to the repulsive power from the gate electrode, in the conventional technique, but that a tensile stress is effectively applied in the x-direction after the removal of the polysilicon dummy gate. However, it is found that, in the conventional technique, a compressive stress is applied as Syy, while it disappears just after the removal of the dummy gate. Further, with respect to Szz, little stress is found in the conventional technique but a tensile stress is applied after the removal of the dummy gate. Further, after the removal of the dummy gate insulating film, it is found that Sxx further increases by removing the dummy gate insulating film. The trend of the stresses does not change even after forming the gate electrodes 43 and 63.

FIG. 9 shows a change of the stress in the p-type transistor. Since the p-type transistor uses a stressed (stress liner) film having a compressive stress, contrary to the n-type transistor, the positive/negative stress values are inverted but the trend is the same as in the case of the n-type transistor. Namely, by removing the dummy gates, the Sxx and Szz values increase but the Syy value decreases. Further, it is found that even after forming the gate electrodes 43 and 63, the values still have the same trend.

As a method of estimating a change of mobility according to these stress values, a method of using piezoresistive coefficient is known. According to the piezoresistive coefficient reported in Phys. Rev. vo. 94, pp 42-49 (1954) written by C. S. Smith, each mobility enhancement factor in the n-type and the p-type transistors can be described as follows.

n-type:$(\mu xx/\mu 0)=1+0.316Sxx-0534Syy+0176Szz$ p-type:$(\mu xx/\mu 0)=1-0.718Sxx+0011Syy+0663Szz$ The plot of each mobility enhancement factor in the respective states according to the above formulas is shown in FIG. 10. The Sxx, Syy, and Szz values used for the calculation are those as shown in FIGS. 8 and 9. The mobility enhancement factor is the relative value when the mobility in the state of no stress applied is defined as 1.

As illustrated in FIG. 10, it is found that the mobility is extremely improved by removing the dummy gates 84 and 85. The mobility is further improved by removing the dummy gate insulating film 81. Owing to this, it is found that the removal of the dummy gate insulating film 81 is preferable to the previous formation of High-k insulating film under the dummy gates 84 and 85. The mobility enhancement factor after forming the embedded gate decreases a little in the p-type transistor Tr2 because the TiN of the gate electrode forming layer 42 has a compressive stress. Compared with the conventional technique, however, it is found that the transistor according to the first embodiment improves the mobility enhancement factor in both the n-type and the p-type much more than the conventional technique.

Another embodiment (second embodiment) of a semiconductor device according to the invention, will be described with reference to the schematic cross sectional structural view in FIG. 11.

As illustrated in FIG. 11, element isolating regions 14 which electrically separate an n-type transistor forming region 12 and a p-type transistor forming region 13, are formed on a semiconductor substrate 11. For example, silicon substrate is used for the semiconductor substrate 11 and the element isolating region 14 is formed in the STI (Shallow Trench Isolation) structure including, for example, an oxide film.

A p-type well region 15 with the p-type impurities induced is formed in the semiconductor substrate 11 of the n-type transistor forming region 12, and an n-type well region 16 with the n-type impurities induced is formed in the semiconductor substrate 11 of the p-type transistor forming region 13.

On the semiconductor substrate 11, a side wall insulating film 33 having a first trench 39 which is formed by removing the first dummy gate (not illustrated), is formed in the n-type transistor forming region 12 and a side wall insulating film 53 having a second trench 59 which is formed by removing the second dummy gate (not illustrated), is formed in the p-type transistor forming region 13. The side wall insulating films 33 and 53 are formed, for example, in thicknesses of about 20 nm to 50 nm.

A gate electrode 43 is formed within the first trench 39 through the gate insulating film 41 and a gate electrode 63 is formed within the second trench 59 through the gate insulating film 41.

The gate insulating film 41 is formed, for example, of a hafnium oxide ($HfO_2$) film, a high dielectric constant (High-k) insulating film, with a thickness of about 2 nm to 3 nm. Although this embodiment adopts $HfO_2$, another High-k material, such as HfSiO, tantalum oxide ($Ta_2O_5$), hafnium aluminum oxide ($HfAlO_x$), or the like, may be used, or the surface of the semiconductor substrate 11, e.g. the silicon surface may be simply oxidized, or the high dielectric constant film previously formed on the surface of the semiconductor substrate 11 may be used as the gate insulating film 41.

The gate electrodes 43 and 63 adopt, for example, a metal compound layer or a metal layer. Here, as one example, titanium nitride (TiN) is used. As the metal layer, tungsten (W), titanium (Ti), titanium nitride (TiN), hafnium (Hf), hafnium silicide (HfSi), ruthenium (Ru), iridium (Ir), cobalt (Co), or the like, can be selected. Although the embodiment adopts a single layer film, a plurality of metal films may be layered in order to reduce resistance and adjust the threshold voltage.

In the n-type transistor forming region 12, extension regions 31 and 32 are formed in the semiconductor substrate 11 on the both sides of the first trench 39. Further, source/drain regions 35 and 36 are formed in the semiconductor substrate 11 on the both sides of the first trench 39 through the respective extension regions 31 and 32. As the n-type impurities, phosphorus (P) or arsenic (As) are induced in the extension regions 31 and 32 and the source/drain regions 35 and 36.

Further, in the p-type transistor forming region 13, extension regions 51 and 52 are formed in the semiconductor substrate 11 on the both sides of the second trench 59. Further, source/drain regions 55 and 56 are formed in the semiconductor substrate 11 on the both sides of the second trench 59 through the respective extension regions 51 and 52. As the p-type impurities, boron (B), indium (In), or the like are induced in the extension regions 51 and 52 and the source/drain regions 55 and 56.

Silicide electrodes 37 and 38 are formed on the source/drain regions 35 and 36 and silicide electrodes 57 and 58 are formed on the source/drain regions 55 and 56, hence to reduce resistance in the respective source/drain regions. The silicide electrodes 37, 38, 57, and 58 are respectively formed of a silicide layer containing, for example, cobalt (Co), nickel (Ni), platinum (Pt) or their compound with a thickness of about 20 nm to 50 nm.

In the n-type transistor forming region 12, a first stress applying film 21 having a tensile stress is formed along the side wall insulating film 33 on the semiconductor substrate 11, while in the p-type transistor forming region 13, a second stress applying film 22 having a compressive stress is formed along the side wall insulating film 53 on the semiconductor substrate 11. In this way, it is characterized in that the first stress applying film 21 is formed before the first trench 39 is formed and that the second stress applying film 22 is formed before the second trench 59 is formed.

The first stress applying film 21 is formed, for example, of a silicon nitride film having a tensile stress with a film thickness of about 40 nm. Although this embodiment forms a film having a tensile stress of about 1.2 GPa, the stress is not restricted to this value. A film thickness is not restricted to the above film thickness of the embodiment. Further, the second stress applying Film 22 is formed, for example, of a silicon nitride film having a compressive stress with a film thickness of about 40 nm. Although a film having a compressive stress of 1.2 GPa is formed in the embodiment, the stress is no restricted to this value. A film thickness is not restricted to the above film thickness of the embodiment.

Further, a third stress applying film 23 having a tensile stress is formed on the first stress applying film 21 and a fourth stress applying film 24 having a compressive stress is formed on the second stress applying film 22.

The third stress applying film 23 is formed, for example, of a silicon nitride film having a tensile stress with a film thickness of about 40 nm. Although a film having a tensile stress of 1.2 GPa is formed in the embodiment, the stress is not restricted to this value. A film thickness is not restricted to the above film thickness of the embodiment.

The fourth stress applying film 24 is formed, for example, of a silicon nitride film having a compressive stress with a film thickness of about 40 nm. Although a film having a compressive stress of 1.2 GPa is formed in the embodiment, the stress is not restricted to this value. A film thickness is not restricted to the film thickness of the embodiment.

Further, a first interlayer insulating film 71 and a second interlayer insulating film 72 are formed on the whole surface of the semiconductor substrate 11. The first and second interlayer insulating films 71 and 72 are formed, for example, of a silicon oxide ($SiO_2$) film.

Contact holes 73, 74, 75, and 76 which communicate with the source/drain regions 35, 36, 55, and 56, are formed in the second interlayer insulating film 72 and the first interlayer insulating film 71, and source/drain electrodes 44, 45, 64, and 65 with metal such as tungsten (W) and so on embedded are formed. A semiconductor device 2 including n-type transistor Tr1 and p-type transistor Tr2 is constructed in this way.

Next, another embodiment (second embodiment) of a method of manufacturing a semiconductor device according to the invention, will be described with reference to the cross sectional views of manufacturing processes in FIGS. 12 to 13. Here, a method of manufacturing the semiconductor device, according to the second embodiment, will be described.

The manufacturing method according to the second embodiment will be performed as follows.

First, by performing the processes having been described according to FIGS. 2(1) to 6(15), the surplus gate electrode forming layer 42 and gate insulating film 41 on the first interlayer insulating film 71 are removed such that the gate electrode forming layer 42 is embedded in the trenches 39 and 59, hence to form the gate electrodes 43 and 63, as illustrated in FIG. 12(1). This removing process adopts, for example, the CMP, in which the above layer is polished so that the surface of the first interlayer insulating film 71 is exposed.

Next, as illustrated in FIG. 12(2), the first interlayer insulating film 71 (refer to FIG. 12(1)) is removed according to the dry etching method.

Next, as illustrated in FIG. 12(3), the fourth stress applying film 24 having a compressive stress is formed only on the p-type transistor forming region 13. For example, a silicon nitride film (Compressive liner film) having a compressive stress with a film thickness of about 40 nm is formed on the whole surface, according to the plasma CVD method and it is left just only on the p-type transistor forming region 13, according to the optical lithography technique and the dry etching technique, hence to form the fourth stress applying film 24. Although, in the embodiment, it is formed with a thickness of 40 nm of a film having the same compressive stress of 1.2 GPa as the previously formed second stress applying film 22 having a compressive stress, it is not restricted to this stress and film thickness.

Next, as illustrated in FIG. 13(4), the third stress applying film 23 having a tensile stress is formed only on the n-type transistor forming region 12. For example, a silicon nitride film (Tensile liner film) having a tensile stress with a film thickness of 40 nm is formed on the whole surface, according to the plasma CVD method and it is left just only on the n-type transistor forming region 12, according to the optical lithography technique and the dry etching technique, hence to form the third stress applying film 23. Although, in the embodiment, it is formed with a film thickness of 40 nm of a film having the same tensile stress of 1.2 GPa as the previously formed first stress applying film 21 having a tensile stress, it is not restricted to this stress and film thickness.

Next, as illustrated in FIG. 13(5), an interlayer insulating film 77 is formed. This interlayer insulating film 77 is formed, for example, of silicon oxide ($SiO_2$).

Next, as illustrated in FIG. 13(6), contact holes 73, 74, 75, and 76 which communicate with the source/drain regions 35, 36, 55, and 56, are bored in the interlayer insulating film 77 through the dry etching technique, then, metal including tungsten (W) and so on is embedded to form the source/drain electrodes 44, 45, 64, and 65, hence to complete a semiconductor device 2 including the n-type transistor Tr1 and the p-type transistor Tr2.

Next, the increasing effect of a stress in the above second embodiment will be described with reference to FIGS. 14 to 16. FIG. 14 shows the stress simulation values in the n-type transistor according to the conventional technique, the first embodiment, and the second embodiment.

As illustrated in FIG. 14, it is found that, in the second embodiment, the compressive stress in the depth direction is recovered to a degree because the third stress applying film having a tensile stress is formed on the gate electrode manufactured through the embedding process, while in the first embodiment, the compressive stress (Syy) in the depth direction is decreased because the top of the first stress applying film having a tensile stress is removed through the CMP and the dummy gate is removed by etching. According to the formula of mobility enhancement factor shown in the first embodiment, it is found that, in the n-type transistor, the mobility is improved more as the compressive stress, that is, the minus value of the stress (Syy) in the depth direction, becomes larger. Therefore, the third stress applying film having a tensile stress is effective in improving the mobility.

As illustrated in FIG. 15, by forming the fourth stress applying film having a compressive stress even in the p-type transistor, the Syy value becomes larger. In the case of the p-type transistor, however, the effect is restrictive because the coefficient of the Syy is small in the formula for mobility enhancement factor.

As illustrated in FIG. 16 indicating the improving ratio of mobility calculated based on the respective stress values, the second embodiment can achieve the further improvement of mobility both in the n-type and p-type transistors than the first embodiment.

Next, another embodiment (third embodiment) of a semiconductor device according to the invention, will be described with reference to the schematic cross sectional structural view in FIG. 17.

As illustrated in FIG. 17, a semiconductor device 3 according to the third embodiment is constituted in that a third stress applying film 23 having a tensile stress is formed on the first and second stress applying films 21 and 22 so as to cover the respective gate electrodes 43 and 63, on the basis of the semiconductor device 1 in the first embodiment having been described with FIG. 1. The other components are the same as those of the semiconductor device 1 in the first embodiment. In the drawing, the illustration of the source/drain electrodes is omitted.

Next, another embodiment (third embodiment) with respect to a method of manufacturing a semiconductor device according to the invention, will be described. Here, a method of manufacturing the semiconductor device 3 will be described.

According to the manufacturing method in the third embodiment, the processes up to FIG. 12(2) are performed and thereafter, the third stress applying film 23 having a tensile stress is formed on the whole surface, as illustrated in FIG. 17. Thereafter, the processes after FIG. 12(5) will be performed.

In the semiconductor device 3 according to the third embodiment, the first stress applying film 21 having a tensile stress and the second stress applying film 22 having a compressive stress in the first layer are the same as those of the first and the second embodiments but in the second layer, there exists only the third stress applying film 23 having a tensile stress. According to this, it is not necessary to form a stress applying film in the second layer separately in the n-type and the p-type like in the second embodiment, thereby reducing the process and improving the yield. Although, in the third embodiment, the third stress applying film 23 having a tensile stress adopts a silicon nitride film having a tensile stress of 1.2 GPa with a thickness of 40 nm, the film thickness and the internal stress are not restricted to the above. In the embodiment, since the p-type transistor has the third stress applying film 23 having a tensile stress, its property changes in an undesirable direction but the undesirable power is not so large.

Next, another embodiment (fourth embodiment) of a semiconductor device according to the invention, will be described with reference to the schematic cross sectional view in FIG. 18.

As illustrated in FIG. 18, in the semiconductor device 4 according to the fourth embodiment, the source/drain regions 55 and 56 of the p-type transistor are formed by stress applying sources, on the basis of the semiconductor device 3 according to the third embodiment having been described with FIG. 17. This stress applying source is formed, for example, of a silicon germanium (SiGe) layer. The other components are the same as those of the semiconductor device 3.

Next, another embodiment (fourth embodiment) of a method of manufacturing a semiconductor device according to the invention, will be described. Here, a method of manufacturing the semiconductor device 4 will be described.

The manufacturing method according to the fourth embodiment will be performed as follows.

First, the processes having been described according to FIGS. 2(1) to 3(6) are performed. At that time, the source/drain regions 55 and 56 of the p-type transistor are formed by the stress applying sources. The stress applying source is formed, for example, through germanium implantation. Alternatively, the forming regions of the source/drain are removed through etching, to form trenches, and a silicon germanium (SiGe) layer is epitaxial-grown selectively in the trench portions. In this case, the other portion is covered with an insulating film to protect against the epitaxial growth. The insulating film is removed after the epitaxial growth. In the fourth embodiment, a silicon germanium (SiGe) layer formed through epitaxial growth is used as the stress applying source having a compressive stress. The germanium (Ge) concentration is, for example, 18% but the germanium concentration is not restricted to this. Although the embodiment adopts SiGe, it is not restricted to SiGe as far as it can apply a compressive stress to a channel region.

Further, a method of applying a compressive stress on a p-type transistor by using SiGe for the source/drain regions is described, for example, in JP-A-2006-186240, "IEDM2003 Technical Digest" written by T. Ghani et al., and "A 90 nm High Volume Manufacturing Logic Technology Featuring Novel 45 nm Gate Length Strained Silicon CMOS Transistors" (p. 987 (US), 2003).

Then, the processes having been described according to FIGS. 4(7) to 6(15) are performed. After the process shown in FIG. 12(2), the third stress applying film 23 having a tensile stress is formed on the whole surface, as illustrated in FIG. 17. The processes after the process shown in FIG. 12(5) are performed.

The effects of the third and fourth embodiments will be described using the simulation results shown in FIGS. 19 and 20. With respect to the n-type transistor, the results are the same as in the case of the second embodiment 2 and their description is omitted. FIG. 19 shows the stress simulation results in the p-type transistor according to the conventional technique, the first embodiment, the third embodiment, and the fourth embodiment. Further, FIG. 20 shows a comparison of mobility enhancement factor in the respective cases.

As illustrated in FIG. 19, the third stress applying film 23 in the second layer formed in the p-type transistor is a film having a tensile stress in the third embodiment, and according to this effect, the value of compressive stress of Syy becomes larger than that of the first embodiment. According to the formula for mobility enhancement factor, mobility gets smaller in the p-type transistor as the compressive stress of Syy gets larger. In the fourth embodiment, since the compressive stress source is formed in the source/drain regions, the compressive stress (Sxx) in the channel direction increases largely.

As illustrated in FIG. 20, in the third embodiment, since the compressive stress (Syy) in the depth direction increases, mobility enhancement factor gets smaller than that in the case of the first embodiment, but the mobility is more improved compared with the conventional technique. Since the compressive stress (Sxx) in the channel direction is much improved in the fourth embodiment, a larger mobility enhancement factor can be achieved. In the third and the fourth embodiments, a stress applying film in the second layer is formed of a silicon nitride film having a tensile stress in order not to deteriorate the mobility enhancement in the n-type transistor; when the mobility enhancement in the p-type transistor is important, however, the stress applying film in the second layer may be formed of a compressive liner film having a compressive stress.

Another embodiment (fifth embodiment) of a semiconductor device according to the invention, will be described according to the schematic cross sectional view in FIG. 21.

As illustrated in FIG. 21, a semiconductor device 5 according to the fifth embodiment is constituted in that a stress applying film is not formed in the p-type transistor, on the basis of the semiconductor device 4 according to the fourth embodiment having been described in FIG. 18. Namely, as the stress applying film, there are only the first stress applying film 21 and the third stress applying film 23 each having a tensile stress in the n-type transistor. The other components are the same as those of the semiconductor device 4.

Next, another embodiment (fifth embodiment) of a method of manufacturing a semiconductor device according to the invention, will be described. Here, the method of manufacturing the semiconductor device 5 will be described.

According to the manufacturing method of the fifth embodiment, a second stress applying film having a compressive stress is not formed but a third stress applying film 23 having a tensile stress is formed on the first stress applying film 21 having a tensile stress, and the third stress applying film 23 in the p-type transistor region is removed, on the basis of the manufacturing method of the fourth embodiment. The other processes are the same as those of the manufacturing method of the fourth embodiment.

In the fifth embodiment, the process can be further shortened than in the fourth embodiment. Further, stress applying films having stresses (the first stress applying film 21 and the third stress applying film 23 having tensile stresses) are formed only on the n-type transistor. While, in the p-type transistor, the source/drain regions 55 and 56 are formed of SiGe layer through epitaxial growth so that the source/drain regions 55 and 56 may be stress applying sources, similarly to the fourth embodiment. According to this, since the channel region of the p-type transistor receives a compression power from the SiGe layer in the channel direction, mobility can be enhanced and ability of transistor can be improved without forming a stress applying film having a compressive stress. Although the fifth embodiment adopts SiGe, it is not restricted to SiGe as far as it can apply a compressive stress on a channel region.

Another embodiment (sixth embodiment) of a semiconductor device according to the invention, will be described with reference to the schematic cross sectional structural view in FIG. 22.

As illustrated in FIG. 22, the semiconductor device 6 of the sixth embodiment is constituted in that the third stress applying film 23 having a tensile stress is formed on the whole surface, on the basis of the semiconductor device 5 of the fifth embodiment. The other components are the same as those of the semiconductor device 5 of the fifth embodiment.

Next, another embodiment (sixth embodiment) of a method of manufacturing a semiconductor device of the invention, will be described. Here, a manufacturing method of the semiconductor device 6 will be described.

According to the manufacturing method of the sixth embodiment, the third stress applying film 23 having a tensile stress is formed on the whole surface and is left there without removing the third stress applying film 23 in the p-type transistor region, on the basis of the manufacturing method of the fifth embodiment. The other manufacturing processes are the same as those of the manufacturing method of the fifth embodiment.

In the semiconductor device 6 in the sixth embodiment, although the third stress applying film having a tensile stress works in a direction of deteriorating the transistor ability in the p-type transistor, the third stress applying film is formed after the gate electrode is formed and therefore, its effect is not so large, similarly to the third embodiment. Further, although the first stress applying film and the third stress applying film having tensile stresses are formed in the first layer and the second layer on the n-type transistor, the third stress applying film in the second layer may be omitted for the purpose of shortening the process.

The effects of the fifth and the sixth embodiments will be described by using the simulation results shown in FIG. 23 and FIG. 24. The n-type transistor is the same as in the case of the second embodiment and its description is omitted. FIG. 23 shows the stress simulation results in the p-type transistor according to the conventional technique, the first embodiment, the fifth embodiment, and the sixth embodiment. FIG. 24 shows a comparison of mobility enhancement factor in the respective cases.

As illustrated in FIG. 23, according to the fifth embodiment, since the compressive stress sources including SiGe are used in the source/drain regions instead of a stress applying film having a compressive stress in the p-type transistor, they take the almost same values as those of the first embodiment. Since the third stress applying film having a tensile stress is formed in the sixth embodiment, the compressive stress of Sxx decreases to a degree and the compressive stress of Syy largely increases.

As illustrated in FIG. 24, in the fifth embodiment, since the compressive stress (Sxx) in a horizontal direction increases, mobility enhancement factor gets larger compared with that of the first embodiment. On the other hand, in the sixth embodiment, since the compressive stress of Syy increases due to the effect of the third stress applying film 23 having a tensile stress, mobility enhancement factor is substantially the same as the enhancement ratio of the first embodiment. The both cases can achieve larger mobility enhancement factor compared with the conventional technique. In the fifth and sixth embodiments, the source/drain regions 55 and 56 in the p-type transistor are formed of SiGe layer, hence to apply a compressive stress in a channel, while also in the n-type transistor, the source/drain regions 35 and 36 in the n-type transistor may be formed of layer having a tensile stress, such as SiC and so on, thereby making a structure of having stress applying sources in the source/drain regions 35 and 36 similarly.

Another embodiment (seventh embodiment) of a semiconductor device according to the invention, will be described with reference to the schematic cross sectional structural view in FIG. 25.

As illustrated in FIG. 25, the semiconductor device 7 according to the seventh embodiment is constituted in that the source/drain regions 55 and 56 in the p-type transistor are formed by stress applying sources, on the basis of the semiconductor device 2 of the second embodiment having been described according to FIG. 11. The stress applying source is formed, for example, of a silicon germanium (SiGe) layer. The other components are the same as those of the semiconductor device 2.

Next, another embodiment (seventh embodiment) of a method of manufacturing a semiconductor device according to the invention, will be described. Here, a manufacturing method of the semiconductor device 7 will be described.

According to the manufacturing method of the seventh embodiment, the source/drain regions 55 and 56 in the p-type transistor are formed of stress applying sources, on the basis of the manufacturing method of the second embodiment. The stress applying source is formed, for example, through germanium implantation. Alternatively, the source/drain forming regions are removed through etching to form trenches, and a silicon germanium (SiGe) layer is selectively epitaxial-grown in the trench portions. In this case, the other region is covered with an insulating film so as to protect against the epitaxial growth. This insulating film is removed after the epitaxial growth. In the fourth embodiment, a silicon germanium (SiGe) layer epitaxially grown is used as a stress applying source having a compressive stress. The germanium (Ge) concentration is, for example, 18% but the germanium concentration is not restricted to this. Although the embodiment adopts SiGe, it is not restricted to SiGe as far as it can apply a compressive stress to a channel region.

In the semiconductor device 7 of the seventh embodiment, a SiGe layer manufactured through the epitaxial growth is formed in the source/drain regions 55 and 56 in the p-type transistor, similarly to the third and the fourth embodiments, and further the second stress applying film and the fourth stress applying film having compressive stresses are formed, similarly to the second embodiment. Therefore, compressive stress from the SiGe layer and compressive stresses from the second and third stress applying films are applied on the channel regions under the gate electrode in the p-type transistor, thereby applying a large stress on a channel region. Further, the same structure as that of the second embodiment is adopted in the n-type transistor, thereby enhancing mobility extremely both in the n-type and p-type transistors.

Further, also in the seventh embodiment, a layer having a tensile stress, such as SiC and so on, is formed in the source/drain regions in the n-type transistor, thereby making a structure of having a stress applying source in the source/drain regions.

What is claimed is:

1. A semiconductor device comprising:
an n-type transistor comprising, in a cross section:
(a) a first sidewall insulating film on a substrate,
(b) a first gate insulating film having side surfaces and a bottom surface, the side surfaces of the first gate insulating film connecting with the bottom surface of the first gate insulating film to define a first region, the first gate insulating film comprising a high dielectric constant material,
(c) a first metal gate electrode formed in the first region,
(d) first source/drain regions in the substrate,
(e) a first silicon nitride film formed at an outside of the first metal gate electrode, and
(f) a second silicon nitride film formed over the first metal gate electrode, a portion of the second silicon nitride film contacting with the first metal gate electrode;
a p-type transistor comprising, in the cross section:
(a) a second sidewall insulating film on the substrate,
(b) a second gate insulating film having side surfaces and a bottom surface, the side surfaces of the second gate insulating film connecting with the bottom surface of the second gate insulating film to define a second region, the second gate insulating film comprising the high dielectric constant material,
(c) a second metal gate electrode formed in the second region,
(d) second source/drain regions in the substrate,
(e) a third silicon nitride film formed at an outside of the second metal gate electrode, and
(f) a fourth silicon nitride film formed over the second metal gate electrode, a portion of the fourth silicon nitride film contacting with the second metal gate electrode.

2. The semiconductor device according to claim 1, wherein the first source/drain regions include Si, and the second source/drain regions include SiGe.

3. The semiconductor device according to claim 2, wherein the first silicon nitride film, the second silicon nitride film, the third silicon nitride film, and the fourth silicon nitride film are stress applying films.

4. The semiconductor device according to claim 3, further comprising:
a first channel region under the first gate electrode, the first channel region is applied to tensile stress, and
a second channel region under the second gate electrode, the second channel region is applied to compressive stress.

5. The semiconductor device according to claim 4, wherein the first silicon nitride film and the second silicon nitride film have the tensile stress, and the third silicon nitride film and the fourth silicon nitride film have the compressive stress.

6. The semiconductor device according to claim 5, wherein the first silicon nitride film applies the tensile stress to the first channel region under the first gate electrode, and the third silicon nitride film applies the compressive stress to the second channel region under the second gate electrode.

7. The semiconductor device according to claim 6, wherein the second silicon nitride film applies the tensile stress to the first channel region under the first gate electrode, and the fourth silicon nitride film applies the compressive stress to the second channel region under the second gate electrode.

8. The semiconductor device according to claim 4, wherein the first silicon nitride film is not formed above the first metal gate electrode, and the third silicon nitride film is not formed above the second metal gate electrode.

9. The semiconductor device according to claim 1, wherein the first metal gate electrode and the second metal gate electrode include metal films, the metal films are layered to adjust a respective threshold voltage.

10. The semiconductor device according to claim 1, wherein the second nitride film is not overlapped with the fourth nitride film.

11. The semiconductor device according to claim 1, wherein a interlaying insulating film is outside of the first silicon nitride film and the third silicon nitride film.

12. A semiconductor device comprising:
an n-type transistor comprising, in a cross section:
(a) a first sidewall insulating film on a substrate,
(b) a first gate insulating film having side surfaces and a bottom surface, the side surfaces of the first gate insulating film connecting with the bottom surface of the first gate insulating film to define a first region, the first gate insulating film comprising a high dielectric constant material,
(c) a first metal gate electrode formed in the first region,
(d) first source/drain regions in the substrate,
(e) a first silicon nitride film formed at an outside of the first metal gate electrode, and
(f) a second silicon nitride film formed outside of the first silicon nitride film, the second silicon nitride film formed between the first silicon nitride film and an interlaying insulating film;
a p-type transistor comprising, in the cross section,
(a) a second sidewall insulating film on the substrate,
(b) a second gate insulating film having side surfaces and a bottom surface, the side surfaces of the second gate insulating film connecting with the bottom surface of the second gate insulating film to define a second region, the second gate insulating film comprising the high dielectric constant material,
(c) a second metal gate electrode formed in the second region,
(d) second source/drain regions in the substrate,
(e) a third silicon nitride film formed at an outside of the second metal gate electrode, and
(f) a fourth silicon nitride film formed outside of the third silicon nitride film, the fourth silicon nitride film formed between the second silicon nitride film and the interlaying insulating film.

13. The semiconductor device according to claim 12, wherein the first source/drain regions include Si, and the second source/drain regions include SiGe.

14. The semiconductor device according to claim 13, wherein the first silicon nitride film, the second silicon nitride film, the third silicon nitride film, and the fourth silicon nitride film are stress applying films.

15. The semiconductor device according to claim 14, further comprising:
a first channel region under the first gate electrode, the first channel region is applied to tensile stress, and
a second channel region under the second gate electrode, the second channel region is applied to compressive stress.

16. The semiconductor device according to claim 15, wherein the first silicon nitride film and the second silicon nitride film have the tensile stress, and the third silicon nitride film and the fourth silicon nitride film have the compressive stress.

17. The semiconductor device according to claim 16, wherein the first silicon nitride film applies the tensile stress to the first channel region under the first gate electrode, and the third silicon nitride film applies the compressive stress to the second channel region under the second gate electrode.

18. The semiconductor device according to claim 17, wherein the second silicon nitride film applies the tensile stress to the first channel region under the first gate electrode, and the fourth silicon nitride film applies the compressive stress to the second channel region under the second gate electrode.

19. The semiconductor device according to claim 15, wherein the first silicon nitride film is not formed above the first metal gate electrode, and the third silicon nitride film is not formed above the second metal gate electrode.

20. The semiconductor device according to claim 12, wherein the first metal gate electrode and the second metal gate electrode include metal films, the metal films are layered to adjust a respective threshold voltage.

21. The semiconductor device according to claim 12, wherein the second nitride film is not overlapped with the fourth nitride film.

22. The semiconductor device according to claim 12, wherein the interlaying insulating film is outside of the first silicon nitride film and the third silicon nitride film.

23. A semiconductor device comprising, in cross section:
a sidewall insulating film on the substrate;
source/drain regions formed in a substrate;
a gate insulating film having side surfaces of the gate insulating film that connect with a bottom surface of the gate insulating film to define a trench region;
a metal gate electrode formed in the trench region;
a first silicon nitride film formed outside of the metal gate electrode; and
a second silicon nitride film formed over the metal gate electrode in a manner that a portion of the second silicon nitride film contacts with the metal gate electrode.

24. The semiconductor device according to claim 23, wherein the source/drain regions include Si when the semiconductor device is n-type transistor, or the source/drain regions include SiGe when the semiconductor device is p-type transistor.

25. The semiconductor device according to claim 24, wherein the first silicon nitride film and the second silicon nitride film are stress applying films.

26. The semiconductor device according to claim 25, further comprising:
a channel region under the gate electrode, wherein the channel region is applied to tensile stress when the semiconductor device is n-type transistor, or the channel region is applied to compressive stress when the semiconductor device is p-type transistor.

27. The semiconductor device according to claim 26, wherein the first silicon nitride film and the second silicon nitride film have the tensile stress when the semiconductor device is n-type transistor, or the first silicon nitride film and the second silicon nitride film have the compressive stress when the semiconductor device is p-type transistor.

28. The semiconductor device according to claim 27, wherein the first silicon nitride film and the second silicon nitride film apply the tensile stress to the channel region when the semiconductor device is n-type transistor, or the first silicon nitride film and the second silicon nitride film apply the compressive stress to the channel region when the semiconductor device is p-type transistor.

29. The semiconductor device according to claim 26, wherein the first silicon nitride film is not formed above the metal gate electrode.

30. The semiconductor device according to claim 23, wherein the metal gate electrode include metal films, the metal films are layered to adjust a respective threshold voltage.

31. The semiconductor device according to claim 23, wherein a interlaying insulating film is outside of the first silicon nitride film and the third silicon nitride film.

* * * * *